US012677078B2

(12) United States Patent
Lee et al.

(10) Patent No.: US 12,677,078 B2
(45) Date of Patent: Jul. 7, 2026

(54) HYBRID IMAGE SENSORS WITH MULTIPLE OPERATING MODES

(71) Applicant: OMNIVISION TECHNOLOGIES, INC., Santa Clara, CA (US)

(72) Inventors: Sangjoo Lee, Sunnyvale, CA (US); Andreas Suess, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 0 days.

(21) Appl. No.: 18/919,214

(22) Filed: Oct. 17, 2024

(65) Prior Publication Data

US 2025/0193516 A1    Jun. 12, 2025

Related U.S. Application Data

(60) Provisional application No. 63/608,150, filed on Dec. 8, 2023.

(51) Int. Cl.
H04N 25/77 (2023.01)
H04N 23/667 (2023.01)
(Continued)

(52) U.S. Cl.
CPC ........... H04N 25/77 (2023.01); H04N 23/667 (2023.01); H04N 25/11 (2023.01); H04N 25/134 (2023.01);
(Continued)

(58) Field of Classification Search
CPC ...... H04N 25/77; H04N 23/667; H04N 25/11; H04N 25/134; H04N 25/135; H04N 25/42;
(Continued)

(56) References Cited

U.S. PATENT DOCUMENTS

| | | | |
|---|---|---|---|
| 8,780,240 B2 | 7/2014 | Posch et al. | |
| 9,544,513 B2 * | 1/2017 | Shin .................... | H04N 13/257 |

(Continued)

FOREIGN PATENT DOCUMENTS

| | | |
|---|---|---|
| WO | 2021159231 A1 | 8/2021 |
| WO | 2023106232 A1 | 6/2023 |

(Continued)

OTHER PUBLICATIONS

European Search Report received in EP App No. 24212229.9 dated Jan. 29, 2025, pp. all.

(Continued)

*Primary Examiner* — Chiawei Chen
(74) *Attorney, Agent, or Firm* — Dorsey & Whitney LLP

(57) ABSTRACT

Hybrid image sensors with multiple operating modes are disclosed herein. In one embodiment, a pixel arrangement includes a first photosensor, a first floating diffusion, a second photosensor, a second floating diffusion, and a mode switch. The mode switch can include (a) a first switch selectively coupling the second floating diffusion to the first floating diffusion, and (b) a second switch configured to selectively couple the second floating diffusion to event vision sensor (EVS) readout circuitry. The mode switch can be used to transition the pixel arrangement between (i) a first mode in which the pixel arrangement is controllable to output intensity information corresponding to first light incident on the first photosensor and/or second light incident on the second photosensor, and (ii) a second mode in which the pixel arrangement is controllable to output contrast information corresponding to the first light and/or the second light.

28 Claims, 12 Drawing Sheets

(51) Int. Cl.

| | |
|---|---|
| *H04N 25/11* | (2023.01) |
| *H04N 25/13* | (2023.01) |
| *H04N 25/42* | (2023.01) |
| *H04N 25/47* | (2023.01) |
| *H04N 25/621* | (2023.01) |
| *H04N 25/78* | (2023.01) |
| *H04N 25/79* | (2023.01) |
| *H10F 39/00* | (2025.01) |
| *H10F 39/18* | (2025.01) |

(52) U.S. Cl.
CPC .......... *H04N 25/135* (2023.01); *H04N 25/42* (2023.01); *H04N 25/47* (2023.01); *H04N 25/621* (2023.01); *H04N 25/78* (2023.01); *H10F 39/182* (2025.01); *H10F 39/8023* (2025.01); *H10F 39/8053* (2025.01); *H10F 39/8063* (2025.01); *H04N 25/79* (2023.01)

(58) Field of Classification Search
CPC ...... H04N 25/47; H04N 25/621; H04N 25/78; H04N 25/79; H04N 25/704; H04N 25/778; H04N 25/46; H10F 39/182; H10F 39/8023; H10F 39/8053; H10F 39/8063
See application file for complete search history.

(56) References Cited

U.S. PATENT DOCUMENTS

| | | | | |
|---|---|---|---|---|
| 9,961,291 | B2 | 5/2018 | Chen | |
| 11,218,659 | B2 | 1/2022 | Xu et al. | |
| 11,240,449 | B2 * | 2/2022 | Mostafalu | H10F 39/807 |
| 11,240,454 | B2 | 2/2022 | Gao et al. | |
| 11,272,133 | B1 * | 3/2022 | Zhang | H04N 25/673 |
| 11,280,918 | B2 * | 3/2022 | Nishihara | H10F 39/10 |
| 11,706,543 | B2 | 7/2023 | Xu et al. | |
| 12,101,563 | B2 | 9/2024 | Wang et al. | |
| 12,442,901 | B2 | 10/2025 | Suess et al. | |
| 2003/0127672 | A1 | 7/2003 | Rahn et al. | |
| 2010/0141812 | A1 | 6/2010 | Hirota | |
| 2010/0214460 | A1 | 8/2010 | Hasegawa et al. | |
| 2010/0295981 | A1 | 11/2010 | Morimoto | |
| 2013/0088625 | A1 | 4/2013 | Iwata et al. | |
| 2013/0181117 | A1 | 7/2013 | Shimizu et al. | |
| 2015/0002635 | A1 | 1/2015 | Kawai et al. | |
| 2015/0077609 | A1 | 3/2015 | Okamoto et al. | |
| 2015/0201118 | A1 | 7/2015 | Lee et al. | |
| 2015/0256777 | A1 | 9/2015 | Ishii et al. | |
| 2016/0353034 | A1 | 12/2016 | Mauritzson et al. | |
| 2017/0125464 | A1 | 5/2017 | Abe et al. | |
| 2017/0127002 | A1 | 5/2017 | Eshel et al. | |
| 2018/0190699 | A1 | 7/2018 | Lee et al. | |
| 2020/0007808 | A1 | 1/2020 | Jung et al. | |
| 2020/0084403 | A1 * | 3/2020 | Suh | H04N 25/77 |
| 2020/0244913 | A1 | 7/2020 | Jung et al. | |
| 2020/0358971 | A1 | 11/2020 | Shim et al. | |
| 2021/0067100 | A1 * | 3/2021 | Choi | H03F 1/26 |
| 2021/0074745 | A1 | 3/2021 | Mi et al. | |
| 2021/0084246 | A1 | 3/2021 | Mostafalu et al. | |
| 2021/0099656 | A1 | 4/2021 | Cho et al. | |
| 2021/0168314 | A1 * | 6/2021 | Mehta | H10F 39/802 |
| 2021/0176417 | A1 | 6/2021 | Xu et al. | |
| 2021/0185264 | A1 | 6/2021 | Wong et al. | |
| 2021/0320140 | A1 | 10/2021 | Kitano et al. | |
| 2021/0377473 | A1 * | 12/2021 | Sano | G01S 17/894 |
| 2021/0399689 | A1 * | 12/2021 | Choi | H03F 3/082 |
| 2021/0400223 | A1 * | 12/2021 | Kitano | H10F 39/811 |
| 2022/0021835 | A1 * | 1/2022 | Suh | H04N 25/47 |
| 2022/0038645 | A1 | 2/2022 | Takahashi | |
| 2022/0078365 | A1 | 3/2022 | Xu et al. | |
| 2022/0102403 | A1 | 3/2022 | Ma et al. | |
| 2022/0141403 | A1 | 5/2022 | Mandelli et al. | |
| 2022/0201236 | A1 | 6/2022 | Gao et al. | |
| 2022/0360730 | A1 | 11/2022 | Fujita et al. | |
| 2023/0007207 | A1 | 1/2023 | Xiao et al. | |

| | | | | |
|---|---|---|---|---|
| 2023/0008577 | A1 | 1/2023 | Niwa | |
| 2023/0020850 | A1 | 1/2023 | Jun et al. | |
| 2023/0217119 | A1 | 7/2023 | Lee et al. | |
| 2023/0239595 | A1 | 7/2023 | Inada et al. | |
| 2023/0282667 | A1 | 9/2023 | Kim | |
| 2023/0283928 | A1 | 9/2023 | Gao et al. | |
| 2023/0308056 | A1 * | 9/2023 | Choi | H04N 25/50 |
| 2023/0336882 | A1 | 10/2023 | Sohn | |
| 2023/0362518 | A1 | 11/2023 | Shiina et al. | |
| 2024/0015414 | A1 | 1/2024 | Mabuchi et al. | |
| 2024/0031697 | A1 * | 1/2024 | Mostafalu | H10F 39/807 |
| 2024/0073557 | A1 * | 2/2024 | Suess | H04N 25/67 |
| 2024/0214708 | A1 | 6/2024 | Finateu et al. | |
| 2024/0267644 | A1 | 8/2024 | Mandelli et al. | |
| 2024/0340552 | A1 * | 10/2024 | Niwa | H04N 25/443 |
| 2024/0380364 | A1 * | 11/2024 | Choi | H04N 25/50 |
| 2025/0008236 | A1 | 1/2025 | Oyama et al. | |
| 2025/0016465 | A1 | 1/2025 | Hunt et al. | |
| 2025/0052901 | A1 * | 2/2025 | Harada | H04N 25/707 |
| 2025/0089384 | A1 * | 3/2025 | Nakamura | H10F 39/1538 |
| 2025/0159374 | A1 | 5/2025 | Sato et al. | |
| 2025/0193538 | A1 | 6/2025 | Suess et al. | |
| 2025/0193541 | A1 | 6/2025 | Suess et al. | |
| 2025/0193550 | A1 | 6/2025 | Suess et al. | |
| 2025/0193555 | A1 | 6/2025 | Suess et al. | |
| 2025/0194271 | A1 | 6/2025 | Suess et al. | |
| 2025/0209572 | A1 | 6/2025 | Zhao et al. | |
| 2025/0358548 | A1 | 11/2025 | Honda | |
| 2025/0359386 | A1 | 11/2025 | Ma | |

FOREIGN PATENT DOCUMENTS

| | | | |
|---|---|---|---|
| WO | 2023186544 | A1 | 10/2023 |
| WO | 2024018812 | A1 | 1/2024 |
| WO | 2024127912 | A1 | 6/2024 |
| WO | 2024160446 | A1 | 8/2024 |

OTHER PUBLICATIONS

U.S. Appl. No. 19/330,257, entitled: "Hybrid CIS/EVS Image Sensor Supporting PDAF in Multiple Operating Modes," filed Sep. 16, 2025, pp. all.

U.S. Appl. No. 19/330,397, entitled: "Image Sensors Supporting Different Gain Levels for Different Pixels," filed Sep. 16, 2025, pp. all.

U.S. Appl. No. 19/352,777, entitled: "Reconfigurable Hybrid Event-Based Vision Sensor and CMOS Image Sensor" filed Oct. 8, 2025, pp. all.

Brandli, et al., "A 240 × 180 130 dB 3 μs Latency Global Shutter Spatiotemporal Vision Sensor", IEEE Journal of Solid-State Circuits, vol. 49, No. 10, Oct. 2014, pp. 2333-2341.

Chen, Shoushun, "Development of Event-based Sensor and Applications", Omnivision Sensor Solutions. Jun. 2021, pp. 1-17.

Guo, et al., "A 3-Wafer-Stacked Hybrid 15MPixel CIS + 1MPixel EVS with 4.6GEvent/s Readout, In-Pixel TDC and On-Chip ISP and ESP Function", ISSCC 2023, Session 5, Image Sensors 5.1, Feb. 20, 2023, p. 1-3.

Kodama, et al., "1.22μm 35.6Mpixel RGB Hybrid Event-Based Vision Sensor with 4.88μm-Pitch Event Pixels and up to 10K Event Frame Rate by Adaptive Control on Event Sparsity", ISSCC, Feb. 20, 2023, Session 5, Image Sensors, 5.2. pp. 1-3.

Li, et al., "Design of an RGBW color VGA rolling and global shutter dynamic and active-pixel vision sensor", 2015 IEEE International Symposium on Circuits and Systems (ISCAS), Lisbon, Portugal, 2015, pp. 718-721, doi: 10.1109/ISCAS.2015.7168734.

Niwa, et al., "A 2.97μm-Pitch Event-Based Vision Sensor with Shared Pixel Front-End Circuitry and Low-Noise Intensity Readout Mode", ISSCC 2023, Session 5 Image Sensors, 5.3, Feb. 20, 2023, pp. 1-3.

Posch, et al., "An asynchronous time-based image sensor", 2008 IEEE International Symposium on Circuits and Systems (ISCAS), Seattle, WA, USA, 2008, pp. 2130-2133, doi: 10.1109/ISCAS.2008.4541871.

U.S. Appl. No. 18/982,869, entitled: "Hybrid CIS/EVS Image Sensor Providing High EVS Resolution," filed Dec. 16, 2024, pp all.

(56)         References Cited

OTHER PUBLICATIONS

Non-Final Office Action received in U.S. Appl. No. 18/918,813 dated Jan. 20, 2026, pp all.
Non-Final Office Action received in U.S. Appl. No. 18/918,591 dated Jan. 23, 2026, pp all.
Non-Final Office Action received in U.S. Appl. No. 18/919,325 dated Feb. 12, 2026, pp all.
Non-Final Office Action received in U.S. Appl. No. 18/919,339 dated Feb. 19, 2026, pp all.
Extended European Search Report received in EP App No. 25209192.1 dated Mar. 31, 2025, pp all.
Extended European Search Report received in EP App No. 25209189.7 dated Mar. 31, 2026, pp all.

* cited by examiner

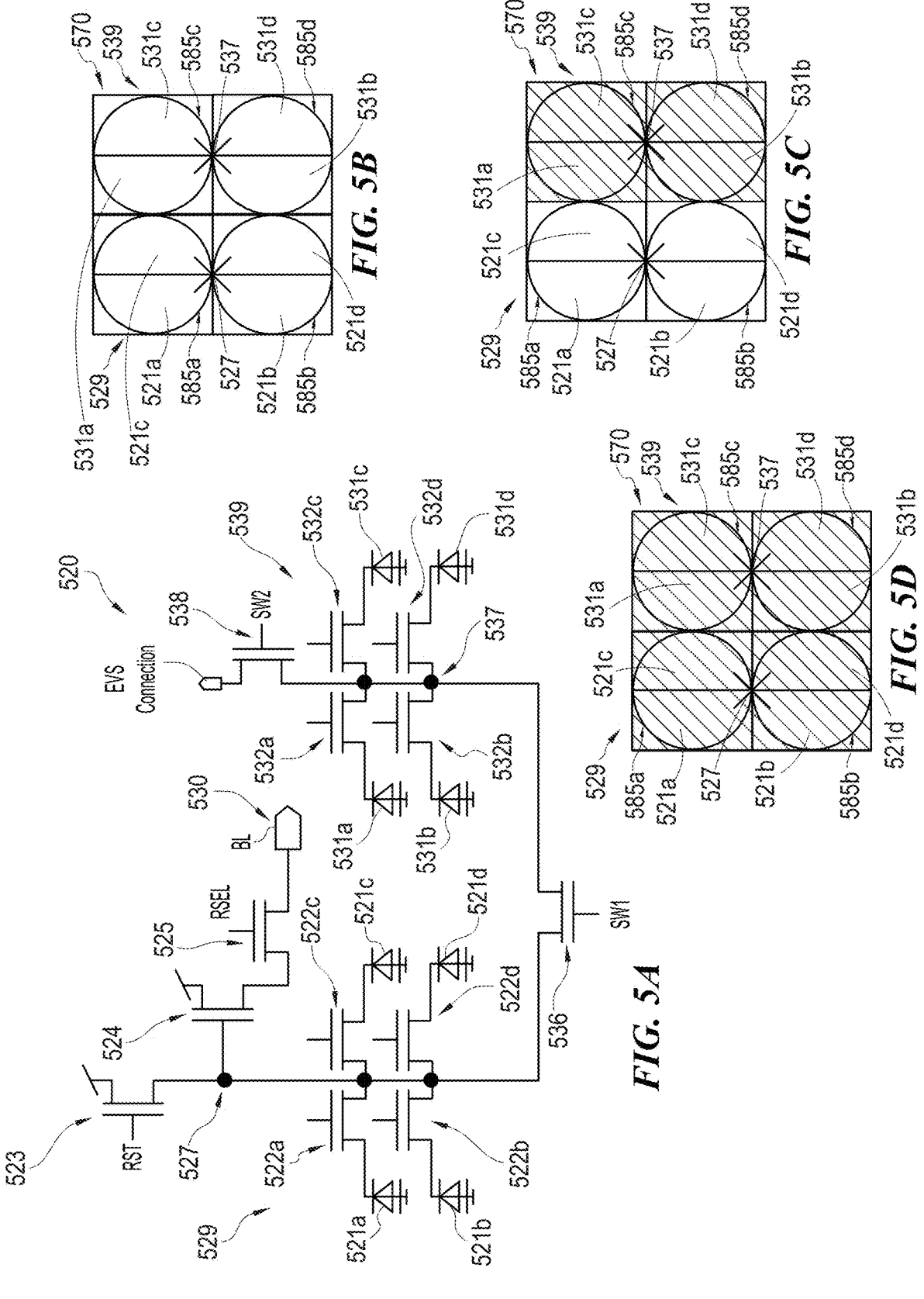

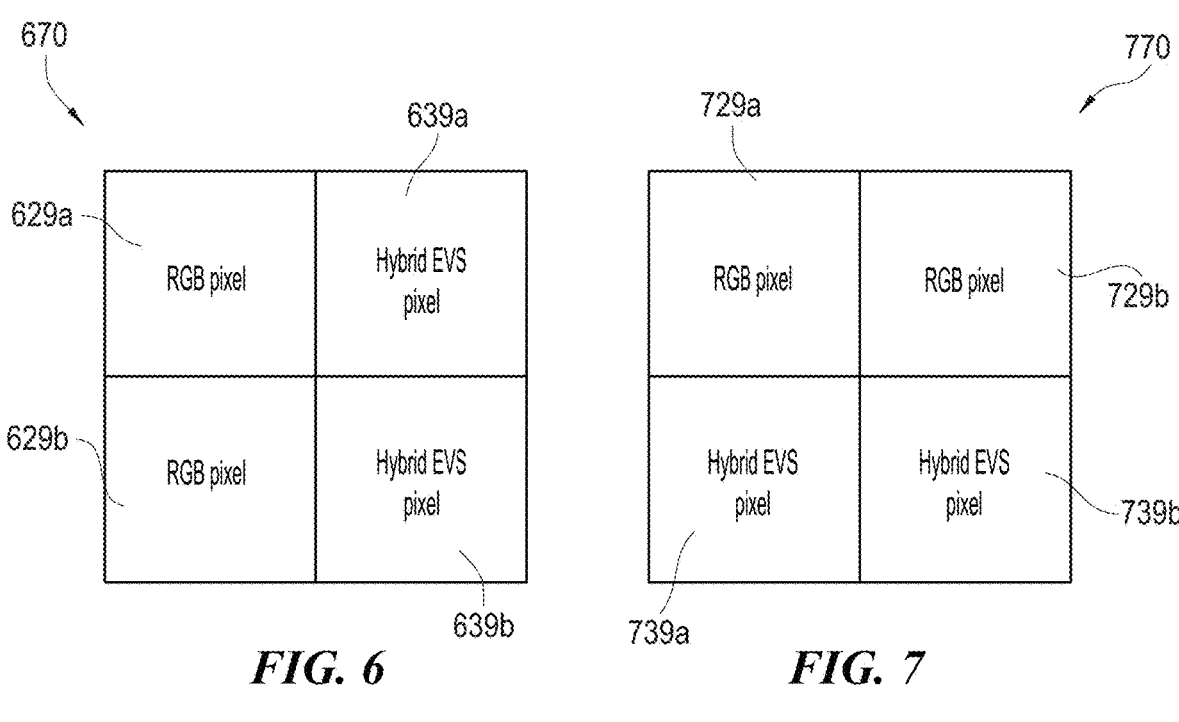
FIG. 6
FIG. 7
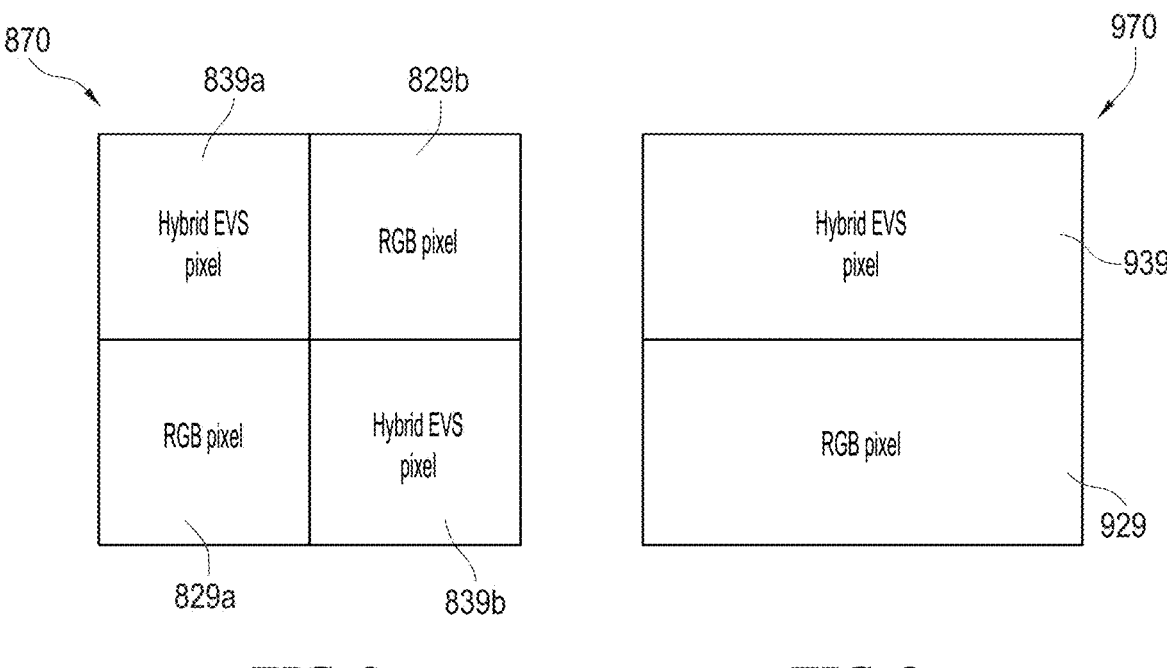
FIG. 8
FIG. 9

HYBRID IMAGE SENSORS WITH MULTIPLE OPERATING MODES

CROSS-REFERENCE TO RELATED APPLICATION(S)

The present application claims the benefit of U.S. Provisional Patent Application No. 63/608,150, filed Dec. 8, 2023, which is incorporated by reference herein in its entirety.

TECHNICAL FIELD

This disclosure relates generally to image sensors. For example, several embodiments of the present technology relate to hybrid image sensors with multiple operating modes, such as a complementary metal oxide semiconductor (CMOS) image sensor (CIS) operating mode, an event-based vision sensor (EVS), and a hybrid CIS and EVS operating mode.

BACKGROUND

Image sensors have become ubiquitous and are now widely used in digital cameras, cellular phones, security cameras, as well as medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to provide information that is representative of the external scene.

BRIEF DESCRIPTION OF THE DRAWINGS

Non-limiting and non-exhaustive embodiments of the present technology are described below with reference to the following figures, in which like or similar reference numbers are used to refer to like or similar components throughout unless otherwise specified.

FIG. 5A is a partially schematic circuit diagram of another pixel arrangement of two pixels, the pixel arrangement configured in accordance with various embodiments of the present technology.

FIGS. 5B-5D are partially schematic diagrams of a pixel array corresponding to the pixel arrangement of FIG. 5A and configured in accordance with various embodiments of the present technology.

FIGS. 6-9 are partially schematic diagrams of other pixel arrangements configured in accordance with various embodiments of the present technology.

Figure 1:
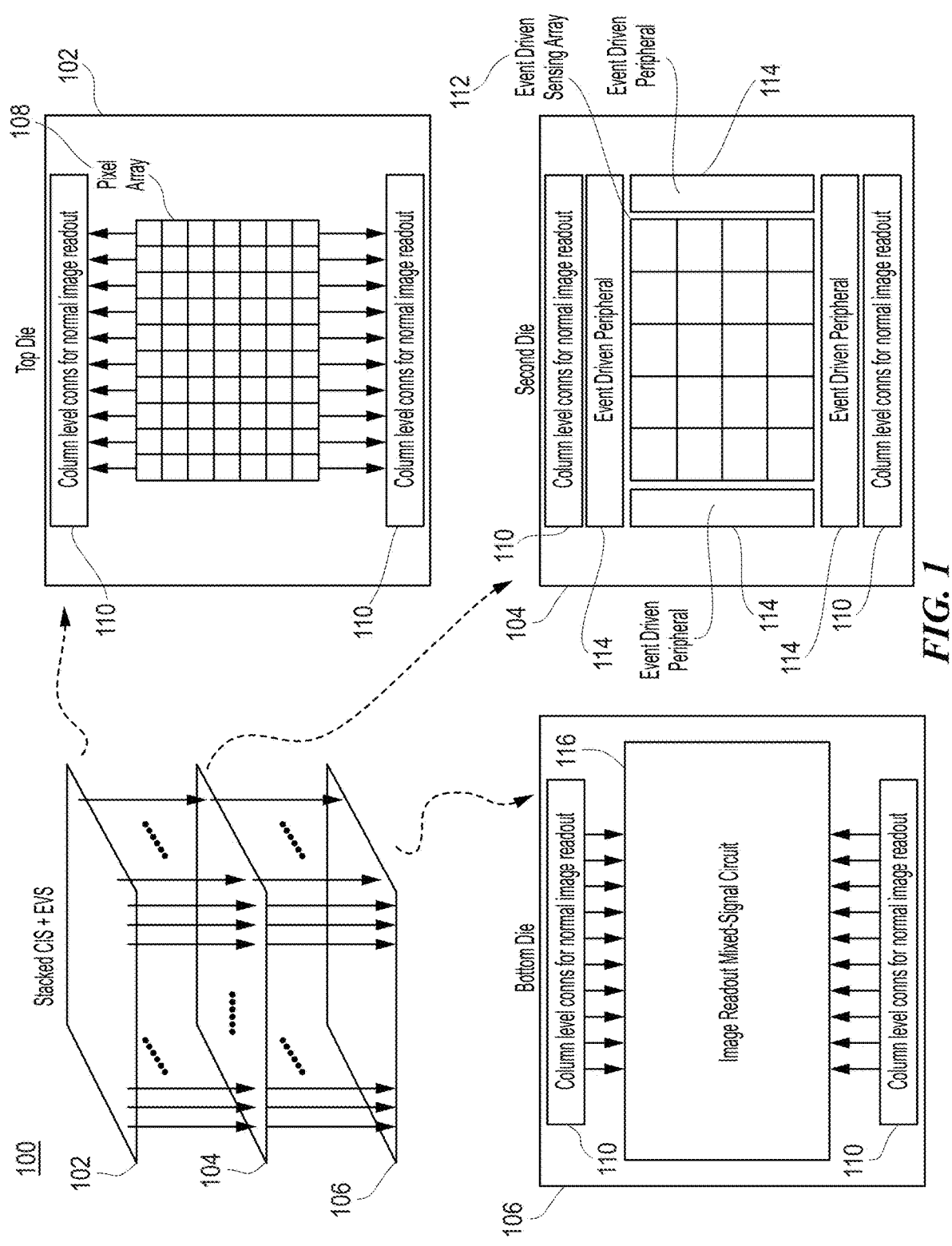
FIG. 1 is a partially schematic diagram of a stacked hybrid complementary metal oxide semiconductor (CMOS) image sensor (CIS) and event-based vision sensor (EVS) system, configured in accordance with various embodiments of the present technology.

Skilled artisans will appreciate that elements in the figures are illustrated for simplicity and clarity and are not necessarily drawn to scale. For example, the dimensions of some of the elements in the figures may be exaggerated relative to other elements to aid in understanding of various aspects of the present technology. In addition, common but well-understood elements or methods that are useful or necessary in a commercially feasible embodiment are often not depicted in the figures, or described in detail below, to avoid unnecessarily obscuring the description of various aspects of the present technology.

DETAILED DESCRIPTION

The present disclosure relates to image sensors with multiple operating modes, and to associated systems, devices, and methods. For example, several embodiments of the present technology are directed to image sensors that can be operated in a CIS operating mode, an EVS operating mode, or a hybrid (CIS and EVS) operating mode. Such image sensors can include a plurality of pixels, with one or more of the pixels including at least one mode switch to facilitate switching between the various operating modes of the image sensors. In the following description, specific details are set forth to provide a thorough understanding of aspects of the present technology. One skilled in the relevant art will recognize, however, that the systems, devices, and techniques described herein can be practiced without one or more of the specific details set forth herein, or with other methods, components, materials, etc.

Reference throughout this specification to an "example" or an "embodiment" means that a particular feature, structure, or characteristic described in connection with the example or embodiment is included in at least one example or embodiment of the present technology. Thus, use of the phrases "for example," "as an example," or "an embodiment" herein are not necessarily all referring to the same example or embodiment and are not necessarily limited to the specific example or embodiment discussed. Furthermore, features, structures, or characteristics of the present technology described herein may be combined in any suitable manner to provide further examples or embodiments of the present technology.

Spatially relative terms (e.g., "beneath," "below," "over," "under," "above," "upper," "top," "bottom," "left," "right," "center," "middle," and the like) may be used herein for case of description to describe one element's or feature's relationship relative to one or more other elements or features as illustrated in the figures. It will be understood that the spatially relative terms are intended to encompass different orientations of a device or system in use or operation, in addition to the orientation depicted in the figures. For example, if a device or system illustrated in the figures is rotated, turned, or flipped about a horizontal axis, elements or features described as "below" or "beneath" or "under" one or more other elements or features may then be oriented "above" the one or more other elements or features. Thus, the exemplary terms "below" and "under" are non-limiting and can encompass both an orientation of above and below. The device or system may additionally, or alternatively, be otherwise oriented (e.g., rotated ninety degrees about a vertical axis, or at other orientations) than illustrated in the figures, and the spatially relative descriptors used herein are interpreted accordingly. In addition, it will also be understood that when an element is referred to as being "between" two other elements, it can be the only element between the two other elements, or one or more intervening elements may also be present.

Temporal relative terms such as "simultaneously," "substantially simultaneously," or "at the same time" are used herein to describe simultaneous performance or operation occurrence in a near instantaneous manner that takes into account necessary delays in signal transmission and/or processing, such as circuitry processing time, signal propagation time, computing time, or the like associated with circuit components. Thus, unless otherwise specified, "simultaneously," "substantially simultaneously," or "at the same time" as used herein may refer to events or operations that occur at the exact same time or within one second or less of each other after taking into account signal transmission and/or processing.

It will be understood that, although the terms first, second, third, etc., may be used in the disclosure and claims to describe various elements, these elements should not be limited by these terms and should not be used to determine the process sequence or formation order of associated elements. Unless otherwise indicated, these terms are merely used to distinguish one element from another element. Thus, a first element discussed below could be termed a second element without departing from the teachings of the disclosed embodiments.

It is appreciated that the term "semiconductor material" recited throughout the disclosure may correspond to a part of or an entirety of a semiconductor wafer (e.g., a silicon wafer). In some embodiments, the semiconductor material may include or otherwise formed of silicon, a silicon germanium alloy, germanium, a silicon carbide alloy, an indium gallium arsenide alloy, any other alloys formed of III-V group compounds, combinations thereof, one or more epitaxial layers of the aforementioned materials, or a bulk substrate thereof. More specifically, semiconductor material may correspond to any semiconductor material or combination of materials that may be doped or otherwise configured to facilitate the formation of an integrated circuit (e.g., forming individual circuitry components such as source/drain regions of transistors, memory elements, photodiodes, or the like). It is appreciated that the term "photodiode" may correspond to a doped region disposed within the semiconductor material configured to photogenerate image charge(s) (e.g., one or more electrons or holes) in response to incident light. For example, photodiode may correspond to an n-doped region disposed within a p-type semiconductor material or an n-doped region surrounded by a p-type well disposed within the semiconductor material.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

A. Overview

Hybrid image sensors with multiple operating modes (and associated systems, devices, and methods) are disclosed. For example, several embodiments of the preset technology are directed to various imaging systems with pixel circuits that provide hybrid functionality (e.g., simultaneous image/video capturing and event driven sensing capabilities). Although normal image/video sensors offer great image and/or video capturing capabilities, one of the limitations with normal image/video sensors is that normal image sensors do not provide ultra-high frame rates and ultra-high speed capture capabilities that may be useful in a variety of applications such as machine vision, gaming, and artificial intelligence sensing areas. Attempts to provide typical image/video sensors with such ultra-high frame rates and ultra-high speed capabilities have resulted in compromised solutions that provide poor quality image captures compared to their normal image sensor counterparts.

It is appreciated that circuit designs in accordance with the teachings of the present disclosure address at least some of the issues discussed above. For example, an image sensor or pixel arrangement disclosed herein can operate in a hybrid mode in which the image sensor/pixel arrangement simultaneously provides great image and video capture capabilities using a first set of pixels, and senses events at ultra-high frame rates and at ultra-high speeds using a second set of pixels for a wide variety of event driven (or other) applications. Continuing with this example, the image sensor/pixel arrangement may also operate in (i) a CIS-only mode in which the first set of pixels and the second set of pixels are used to provide image and video capture capabilities and/or (ii) an EVS-only mode in which the first set of pixel and the second set of pixels are used to sense events at ultra-high frame rates and at ultra-high speeds. The image sensor/pixel arrangement can be transitioned between the hybrid mode, the CIS-only mode, and/or the EVS-only mode using a mode switch, such as a mode switch positioned on a same die as the first set of pixels and the second set of pixels.

Thus, as will be shown and described in the various examples below, an example pixel arrangement includes a first photosensor configured to photogenerate first charge (e.g., one or more electrons or holes) based at least in part on first light incident on the first photosensor; a first floating diffusion coupled to CIS readout circuitry and configured to receive the first charge from the first photosensor; a second photosensor different from the first photosensor and configured to photogenerate second charge (e.g., one or more electrons or holes) based at least in part on second light incident on the second photosensor; a second floating diffusion configured to receive the second charge from the second photosensor; and a mode switch. The mode switch can include a first switch selectively coupling the second floating diffusion to the first floating diffusion, and a second switch different from the first switch and configured to selectively couple the second floating diffusion to event vision sensor (EVS) readout circuitry. The mode switch can be used to transition the pixel arrangement between (i) a first mode (e.g., a CIS-only mode) in which the pixel arrangement is controllable to generate first output corresponding to intensity information of the first light and the second light, (ii) a second mode (e.g., a hybrid mode) in which the pixel arrangement is controllable to (e.g., simultaneously) generate (a) second output corresponding to contrast information (or other non-CIS information) of the second light and (b) third output corresponding to intensity information of the first light, and/or (iii) a third mode (e.g., an EVS-only mode) in which the pixel arrangement is controllable to generate fourth output corresponding to contrast information (or other non-CIS information) of the first light and the second light. The present technology therefore facilitates transitioning the pixel arrangement between the first mode, the second mode, and/or the third mode using pixel connections and timing control (e.g., of the mode switch).

In some embodiments, the mode switch can be positioned on a same die as the first photosensor and the second photosensor. Positioning the mode switch on the same die as the first photosensor and the second photosensor can reduce an amount of transistors and/or other circuitry required to position all or a portion of a mode switch circuit on a different die, such as a second die that includes the EVS readout circuitry. Additionally, or alternatively, positioning the mode switch on the same die as the first photosensor and the second photosensor can obviate the practice of routing a power supply signal to the different die.

In addition, the present technology offers several other advantages. For example, the present technology facilitates capturing CIS information using conventional CIS readout processes. As another example, the present technology can be implemented into small pixel sizes. As a specific example, the first photosensor and the second photosensor described above (a) can be a first and second photosensor, respectively, of a split photosensor (e.g., a split photodiode) pixel, (b) can be positioned beneath a same microlens, and/or (c) can have different full well capacities or different sensitivities. In embodiments in which the first photosensor and the second photosensor are positioned beneath a same microlens, the first light and the second light may be directed by the same microlens onto the first and second photosensors. As another specific example, the first photosensor and the second photosensor described above (a) can be a first photosensor and a second photosensor, respectively, of a multi-photosensor (e.g., multi-photodiode) pixel, (b) can be of different sizes or include different sensitivities and/or (c) can be configured for different imaging functionalities (e.g., the first photosensor can be configured as an imaging pixel and the second pixel can be configured as a phase-detection pixel or a depth-sensing pixel).

Additionally, or alternatively, the present technology can be implemented into various pixel architectures (e.g., 1×1, 1×2, 2×1, 2×2, or other-sized pixel arrays; phase detection auto-focus; high dynamic range; dual conversion gain; pixels with any number of photosensors, subpixels, transfer transistors, control gates, and/or floating diffusions; pixels with a floating diffusion shared by any number of photosensors). As a specific example, the first photosensor and the second photosensor described above can be part of a first pixel and a second pixel, respectively. In some embodiments, the first pixel and the second pixel can be vertically aligned with one another or can be horizontally aligned with one another. In these and other embodiments, the first pixel and the second pixel can be (a) coupled to a same bitline, (b) coupled to same CIS readout circuitry, and/or (c) coupled to same EVS readout circuitry (e.g., via a same hybrid bond coupling (i) the first pixel and the second pixel positioned on a first die to (ii) event detection circuitry on a second die).

B. Selected Embodiments of Hybrid Imaging Sensors With Multiple Operating Modes, and Associated Systems, Devices, and Methods FIG. 1 is a partially schematic diagram of a stacked complementary metal oxide semiconductor (CMOS) image sensor (CIS) with an event-based vision sensor (EVS) system 100 ("the stacked system 100"), configured in accordance with various embodiments of the present technology. As shown, the stacked system 100 includes a first die 102, a second die 104, and a third die 106 that are stacked and coupled together in a stacked chip scheme. In some embodiments, the first die 102, the second die 104, and the third die 106 are semiconductor dies that include a suitable semiconductor material (e.g., silicon). In the illustrated embodiment, the first die 102 (also referred to herein as the "top die") includes a pixel array 108. The third die 106 (also referred to herein as the "bottom die") includes an image readout circuit 116 (also referred to herein as "image readout mixed-signal circuitry"). The image readout circuit 116 can be coupled to the pixel array 108 of the top die 102 through column level connections for normal image readout 110. In some embodiments, the column level connections for normal image readout 110 are implemented from column bit-lines of the pixel array 108 with through silicon vias (TSVs) that extend between the top die 102 and the bottom die 106, and that are routed through the second die 104.

In some embodiments, the pixel array 108 is a two-dimensional (2D) array including a plurality of pixel cells (also referred to as "pixels") that each includes at least one photosensor (e.g., at least one photodiode) exposed to incident light. As shown in the illustrated embodiment, the pixels are arranged in rows and columns. As discussed further herein, pixels of the pixel array 108 can be operated at least partially as CIS pixels and/or at least partially as EVS pixels. When operated as CIS pixels, the pixels can be used to acquire image data of a person, place, object, etc., which can then be used to render images and/or video of a person, place, object, etc. For example, each CIS pixel is configured to photogenerate image charge in response to the incident light. After each CIS pixel has acquired its image charge, the corresponding analog image charge data can be read out by the image readout circuit 116 in the bottom die 106 through the column bit lines. In some embodiments, the image charge from each row of the pixel array 108 may be read out in parallel through column bit lines by the image readout circuit 116.

The image readout circuit 116 in the bottom die 106 can include amplifiers, analog to digital converter (ADC) circuitry, associated analog support circuitry, associated digital support circuitry, etc., for normal image readout and processing. In some embodiments, the image readout circuit 116 may also include event driven readout circuitry, which will be described in greater detail below. In operation, the photogenerated analog image charge signals are read out from the pixel cells of pixel array 108, amplified, and converted to digital values in the image readout circuit 116. In some embodiments, image readout circuit 116 may read out a row of image data at a time. In other examples, the image readout circuit 116 may read out the image data using a variety of other techniques (not illustrated), such as a serial readout or a full parallel readout of all pixels simultaneously. The image data may be stored or even manipulated by applying post image effects (e.g., crop, rotate, remove red eye, adjust brightness, adjust contrast, and the like).

In the illustrated embodiment, the second die 104 (also referred to herein as the "middle die") includes an event driven sensing array 112 that is coupled to the pixel array 108 in the top die 102. In some embodiments, the event driven sensing array 112 is coupled to the pixels of the pixel array 108 through hybrid bonds between the top die 102 and the middle die 104. The event driven sensing array 112 can include an array of event driven circuits. In some embodiments, each one of the event driven circuits in the event driven sensing array 112 is coupled to at least one of the plurality of pixels of the pixel array 108 through hybrid bonds between the top die 102 and the middle die 104 to asynchronously detect events that occur in light that is incident upon the pixel array 108 in accordance with the teachings of the present disclosure.

In some embodiments, corresponding event detection signals are generated by the event driven circuits in the event driven sensing array 112. The event detection signals can be received and processed by event driven peripheral circuitry 114 that, in some embodiments, is arranged around the periphery of the event driven sensing array 112 in the middle die 104, as is shown in FIG. 1. The embodiment illustrated in FIG. 1 also illustrates column level connections for normal image readout 110 that are routed through the middle die 104 between the top die 102 and the bottom die 106.

Figure 2:
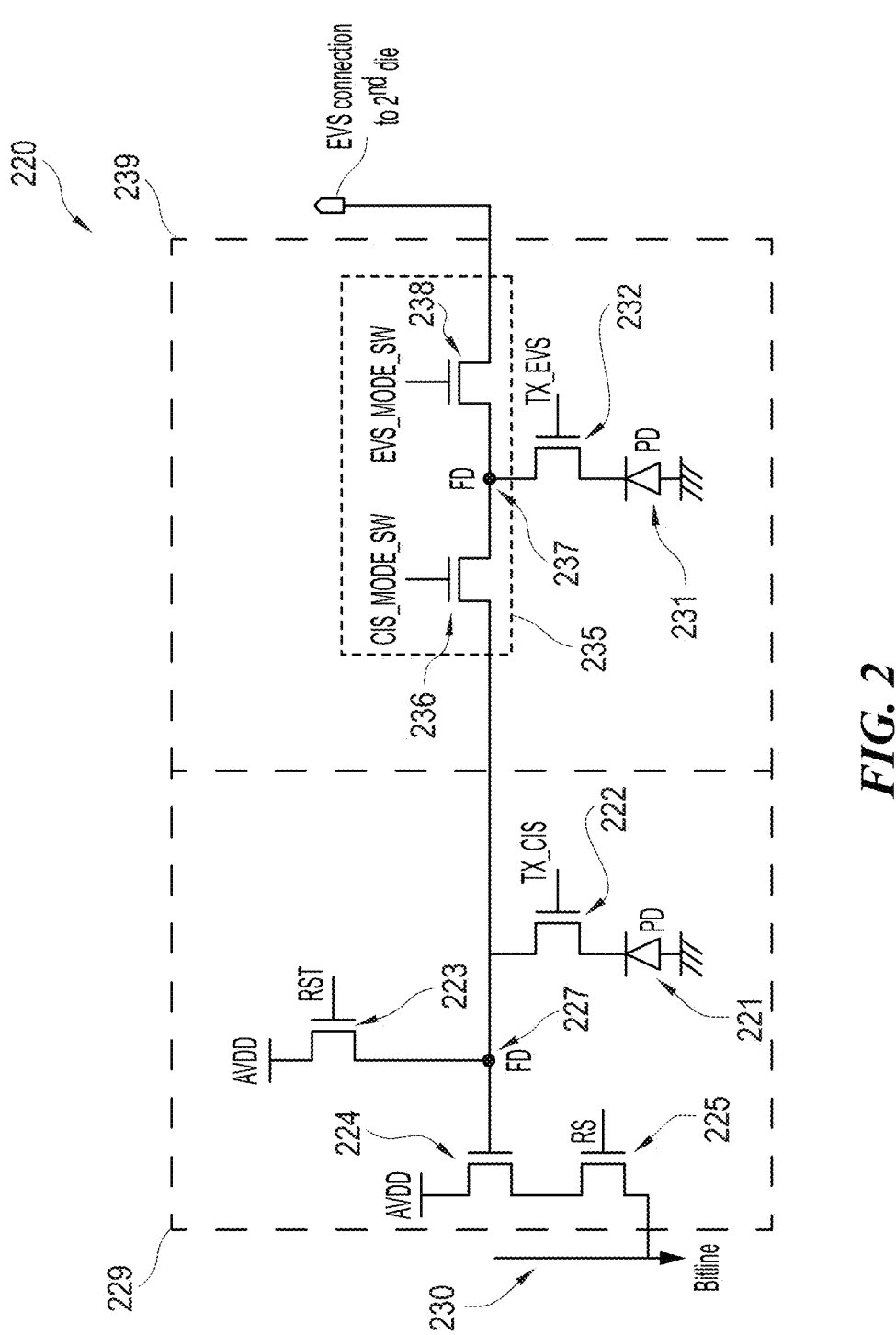
FIG. 2 is a partially schematic circuit diagram of a pixel arrangement of two pixels, the pixel arrangement configured in accordance with various embodiments of the present technology.

FIG. 2 is a partially schematic circuit diagram of a pixel arrangement 220 configured in accordance with various embodiments of the present technology. The pixel arrangement 220 includes two pixels: a first pixel 229 and a second pixel 239. The first pixel 229 and/or the second pixel 239 may be examples of one of the pixels of the pixel array 108 of FIG. 1, or of another pixel configured in accordance with various embodiments of the present technology. In the illustrated embodiment, the first pixel 229 (also referred to herein as an "RGB pixel") includes a photosensor 221 (e.g., a photodiode), a floating diffusion 227, and a transfer transistor 222 selectively coupling the photosensor 221 to the floating diffusion 227 based at least in part on a transfer control signal TX_CIS. The photosensor 221 is configured to photogenerate image charge in response to incident light, and the floating diffusion 227 is configured to receive image charge from the photosensor 221 at least when the transfer transistor 222 is selectively activated using the transfer control signal TX_CIS.

The first pixel 229 further includes a reset transistor 223, a source follower transistor 224, and a row select transistor

225. The reset transistor 223 can selectively couple the floating diffusion 227 to a voltage source (e.g., for reset operations) based at least in part on a reset signal RST. The source follower transistor 224 includes a gate terminal coupled to the floating diffusion 227. The source follower transistor 224 is also coupled between (i) a voltage source (e.g., the same voltage source as—or a different voltage source from—the voltage source to which the reset transistor 223 is coupled) and (ii) the row select transistor 225. The row select transistor 225 is (a) coupled between the source follower transistor 224 and a bitline 230, and (b) is selectively activated based at least in part on a row select signal RS. The source follower transistor 224 and the row select transistor 225 are also collectively referred to herein as "readout circuitry" of the first pixel 229.

Referring now to the second pixel 239 of FIG. 2, the second pixel 239 (also referred to herein as a "hybrid EVS pixel") includes a photosensor 231 (e.g., a photodiode) a floating diffusion 237, and a transfer transistor 232 selectively coupling the photosensor 231 to the floating diffusion 237 based at least in part on a transfer control signal TX_EVS. The photosensor 231 is configured to photogenerate image charge in response to incident light, and the floating diffusion 237 is configured to receive image charge from the photosensor 231 at least when the transfer transistor 232 is selectively activated using the transfer control signal TX_EVS.

The first pixel 229 and the second pixel 239 of FIG. 2 are each illustrated with a single photosensor 221 and 231, respectively. As described in greater detail below, either or both of the first pixel 229 and the second pixel 239 can include a different number of photosensors (e.g., two, three, four, or more photosensors) in other embodiments of the present technology. For example, pixels described in greater detail below with reference to FIGS. 4A-5D, 10, and 11, each include four photosensors. As a specific example, either or both of the first pixel 229 and the second pixel 239 can be split photodiode pixels (e.g., usable for high dynamic range (HDR) applications).

The first pixel 229 and the second pixel 239 of FIG. 2 are also each illustrated with a single control gate (transfer transistor 222 and 232, respectively). In other embodiments, either or both of the first pixel 229 and the second pixel 239 can include a different number of control gates (e.g., two, three, four, or more transfer transistors). For example, the first pixel 229 and/or the second pixel 239 can include one or more transfer transistors for each of their photosensors. As another example, the first pixel 229 and/or the second pixel 239 can include a fewer number of transfer transistors than photosensors (e.g., one transfer transistor for two or more photosensors).

Furthermore, the first pixel 229 of FIG. 2 is illustrated with one floating diffusion (floating diffusion 227), and the second pixel 239 of FIG. 2 is illustrated with one floating diffusion (floating diffusion 237). For example, the first pixel 229 and the second pixel 239 are each illustrated with 1×1 pixel architectures in which a single floating diffusion 227 and 237, respectively, is coupled to (or selectively coupled to) a single photosensor 221 and 231, respectively. In other embodiments, the first pixel 229 and/or the second pixel 239 can include more than one floating diffusion and/or a different number of photosensors coupled to each floating diffusion. For example, a floating diffusion can be shared by (e.g., be coupled or selectively coupled to) one or more photosensors, such as one photosensor, two photosensors, three photosensors, four photosensors, etc. As another example, multiple floating diffusions can share (e.g., be coupled to or selectively coupled to) a same photodiode. As such, the first pixel 229 and/or the second pixel 239 can be configured with any pixel architecture, such as 1×2, 2×1, 1×3, 3×1, 2×2, 3×3, 4×4, among others.

Moreover, the pixel arrangement 220 of FIG. 2 is illustrated as a 1×2 pixel arrangement. In other embodiments, the first pixel 229 and the second pixel 239 can configured in a different pixel arrangement, such as a 2×1 pixel arrangement. In these and still other embodiments, the first pixel 229 and the second pixel 239 can be part of a larger pixel arrangement. For example, the first pixel 229 and/or the second pixel 239 can be configured/arranged in a 1×3 pixel arrangement, a 3×1 pixel arrangement, a 2×2 pixel arrangement, a 3×3 pixel arrangement, a 4×4 pixel arrangement, or another suitable pixel arrangement.

In the embodiment illustrated in FIG. 2, the pixel arrangement 220 further includes a mode switch circuit 235 (also referred to herein as a "mode switch"). As shown, the mode switch circuit 235 includes a first switch 236 (also referred to herein as a "CIS switch," a "CIS mode switch," a "first mode switch," and the like) and a second switch 238 (also referred to herein as an "EVS switch," an "EVS mode switch," a "second mode switch", and the like). The first switch 236 (e.g., a transistor, a standard switch, etc.) is configured to selectively couple the second pixel 239 to the first pixel 229. For example, the first switch 236 is configured to selectively couple the floating diffusion 237 of the second pixel 239 to the floating diffusion 227 of the first pixel 229 based at least in part on a first switch control signal CIS_MODE_SW. As a specific example, the first switch 236 can be electrically positioned between the floating diffusion 237 of the second pixel 239 and the floating diffusion 227 of the first pixel 229. Thus, when the first switch 236 is activated (e.g., turns on), charge accumulated on the floating diffusion 237 can be applied to the gate of the source follower transistor 224 such that a corresponding analog signal can be read out onto the bitline 230 via the row select transistor 225 (e.g., when the row select transistor 225 is activated based at least in part on the row select signal RS and/or when the reset transistor 223 is deactivated based at least in part on the reset signal RST). In other words, activation of the first switch 236 (e.g., when the second switch 238 is turned off or is not activated) can facilitate reading out the second pixel 239 via the readout circuitry of the first pixel 229. Stated another way, activation of the first switch 236 (e.g., when the second switch 238 is not activated) can facilitate reading out intensity information (e.g., a CIS image signal) onto the bitline 230 from either or both of the first pixel 229 and the second pixel 239.

The second switch 238 (e.g., a transistor, a standard switch, etc.) of the mode switch circuit 235 is configured to selectively couple the second pixel 239 to EVS readout circuitry (e.g., one of the event driven circuits included in the event driven sensing array 112 shown in FIG. 1) based at least in part on a second switch control signal EVS_MODE_SW. For example, the second switch 238 can be electrically positioned between the floating diffusion 237 of the second pixel 239 and EVS readout circuitry (e.g., on the second die 104 of FIG. 1), such as between the floating diffusion 237 and a hybrid bond coupling the second pixel 239 (e.g., on the first die 102 of FIG. 1) to a corresponding event driven circuit (e.g., of an event driven sensing array on the second die 104). As another example, the second switch 238 can be electrically positioned (i) such that the floating diffusion 237 is electrically positioned between the second switch 238 and the first switch 236, and/or (ii) such that the second switch 238 is coupled to the first switch 236 via the floating diffusion 237.

When the second switch 238 of the mode switch circuit 235 is activated, charge accumulated on the floating diffusion 237 can be transferred to EVS readout circuitry corresponding to the second pixel 239. In addition, when both the first switch 236 and the second switch 238 are activated together, charge accumulated on the floating diffusion 227 of the first pixel 229 can also be transferred to the EVS readout circuitry corresponding to the second pixel 239 (e.g., when the row select transistor 225 and/or the reset transistor 223 are also not activated). Stated another way, activation of the second switch 238 (e.g., when (a) the first switch 236 is not activated and/or (b) the first switch 236 is activated, the reset transistor 223 is not activated, and/or the row select transistor 225 is not activated) can facilitate generating contrast change (e.g., an event signal) corresponding to either or both of the first pixel 229 and the second pixel 239.

The mode switch circuit 235 therefore facilitates operating the pixel arrangement 220 in any one of three modes: a CIS only mode (also referred to herein as a "first mode") in which both the first pixel 229 and the second pixel 239 of the pixel arrangement 220 can be used to obtain CIS information (e.g., CIS image signals); a hybrid CIS and EVS mode (also referred to herein as a "hybrid mode" or a "second mode") in which the pixel arrangement 220 can be used to (e.g., simultaneously) provide CIS information (e.g., from the first pixel 229) and non-CIS information (e.g., from the second pixel 239); and an EVS only mode (also referred to herein as a "third mode") in which both the first pixel 229 and the second pixel 239 can be used to obtain non-CIS information (e.g., events signals corresponding to change in luminance, event detection, phase detection auto-focus, etc.). Stated another way, the mode switch is usable to transition the pixel arrangement 220 between (a) one or more first modes (e.g., the CIS only mode and/or the hybrid CIS and EVS mode) in which the pixel arrangement is controllable to generate intensity information, luminance information, or CIS information (e.g., color information) output corresponding to light incident on the first pixel 229 and/or the second pixel 239, and (b) one or more second modes (e.g., the hybrid CIS and EVS mode and/or the EVS only mode) in which the pixel arrangement is controllable to generate contrast or other non-CIS information output corresponding to light incident on the first pixel 229 and/or the second pixel 239.

For example, by activating the first switch 236 of the mode switch circuit 235 while the second switch 238 is deactivated, charge accumulated on both the floating diffusion 227 of the first pixel 229 and the floating diffusion 237 of the second pixel 239 can be read out of the first pixel 229 onto the bitline 230 via readout circuitry of the first pixel 229 when the row select transistor 225 is activated using the row select signal RS. Thus, activation of the first switch 236 while the second switch 238 is not activated can correspond to the CIS only mode of the pixel arrangement 220.

Figures 3A, 3B, 3C:
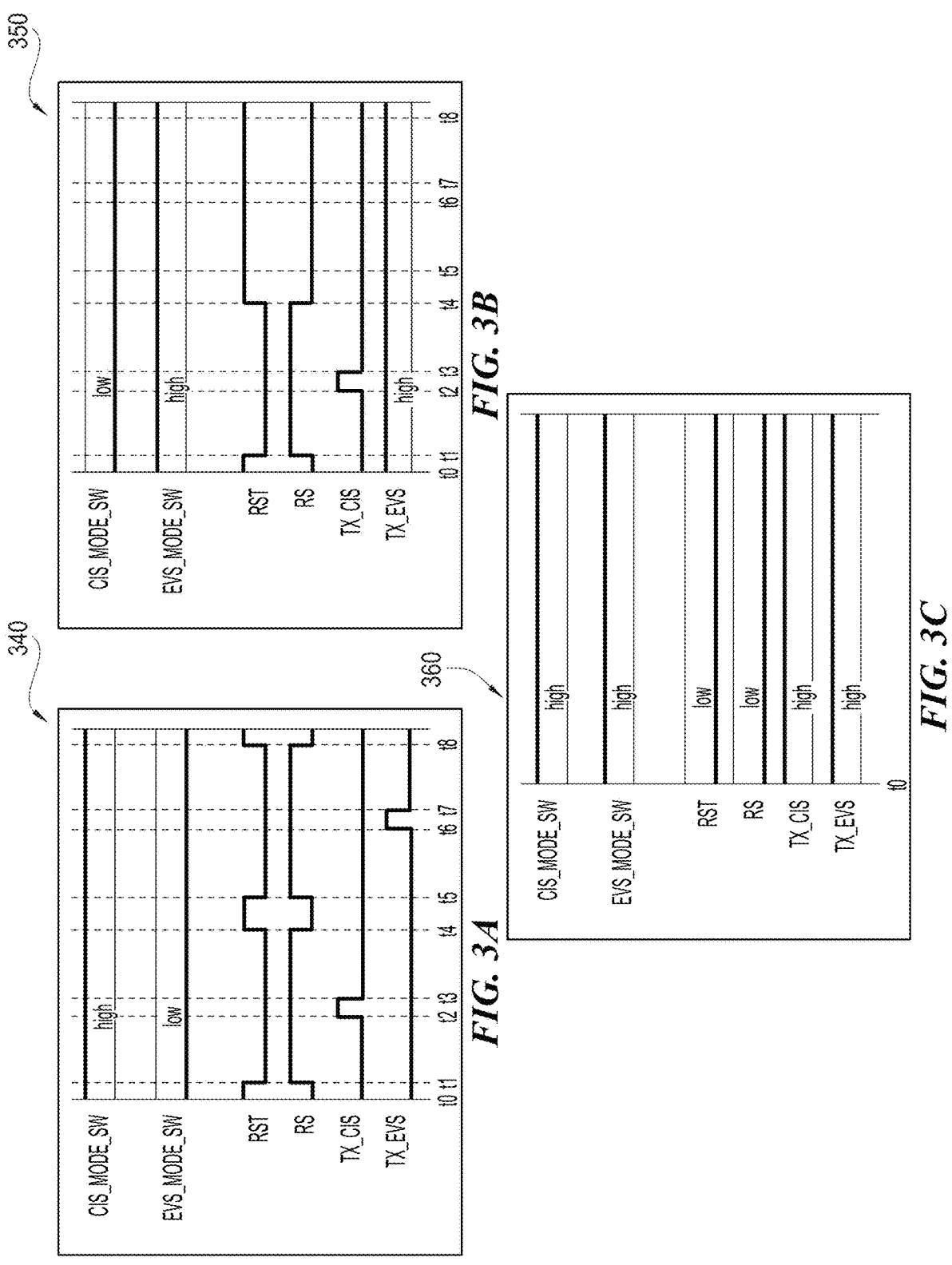
FIGS. 3A-3C are timing diagrams corresponding to various operating modes of the pixel arrangement of FIG. 2 in accordance with various embodiments of the present technology.

FIG. 3A is a timing diagram 340 that corresponds to readout of the pixel arrangement 220 of FIG. 2 while the pixel arrangement 220 is operated in the CIS only mode. Referring to FIGS. 2 and 3A together, at time t0, the first switch control signal CIS_MODE_SW is asserted with, for example, a positive voltage signal (such that the first switch 236 of the mode switch circuit 235 is activated) while the second switch control signal EVS_MODE_SW is unasserted or is applied with, for example, a ground reference voltage level or a negative voltage level (such that the second switch 238 of the mode switch circuit 235 is deactivated). As shown in FIG. 3A, the first switch 236 can remain activated and the second switch 238 can remain deactivated for the remainder of the time shown in the timing diagram 340. While the first switch 236 is activated, the floating diffusion 237 of the second pixel 239 is coupled to the floating diffusion 227 of the first pixel 229.

It is appreciated the definition of a signal being in an asserted state refers to a signal having a voltage level, such as a positive voltage, that is sufficient to turn on a corresponding transistor. A definition of a signal being in an unasserted state refers to a signal having a voltage level, such as a ground or negative voltage, that is sufficient to turn off (or cut off a conduction channel of) a corresponding transistor.

Also, at time t0, the reset signal RST is in an asserted state such that the reset transistor 223 is activated, and the row select signal RS is in an unasserted state such that the row select transistor 225 is deactivated. In addition, the transfer control signal TX_CIS and the transfer control signal TX_EVS are both unasserted, such that the transfer transistor 222 and the transfer transistor 232, respectively, are deactivated. As such, the floating diffusion 227 and the floating diffusion 237 are reset via the reset transistor 223 at time t0.

At time t1, the reset signal RST is unasserted while the row select signal RS is asserted. As such, the reset transistor 223 is deactivated, and the row select transistor 225 is activated. In some embodiments, a first reset level signal (corresponding to charge on the floating diffusions 227 and 237 after resetting the floating diffusions 227 and 237) can be sampled and read out of the first pixel 229 onto the bitline 230 (e.g., for correlated double sampling) between time t1 and time t2.

At time t2, the transfer control signal TX_CIS is asserted, thereby activating the transfer transistor 222 of the first pixel 229. Activation of the transfer transistor 222 couples the photosensor 221 of the first pixel 229 to (i) the floating diffusion 227 of the first pixel 229 and (ii) the floating diffusion 237 of the second pixel 239. Activation of the transfer transistor 222 also allows charge photogenerated by the photosensor 221 in response to incident light to be (a) transferred to the floating diffusion 227 and the floating diffusion 237, and (b) applied to the gate of the source follower transistor 224. Because the row select signal RS remains asserted between time t1 and time t4, a first signal level signal (corresponding to image charge that was (i) photogenerated by the photosensor 221 and (ii) applied to the gate of the source follower transistor 224 between time t2 and time t3) is sampled and read out of the first pixel 229 onto the bitline 230 between time t3 and time t4. At time t3, the transfer control signal TX_CIS is unasserted, thereby deactivating the transfer transistor 222 and uncoupling the photosensor 221 from the floating diffusion 227 and the floating diffusion 237. The interval between time t2 to time t3 may represent a charge transfer period. In some embodiments, an integration or exposure period (not shown) associated with the photosensor 221 can occur prior to time t2. In these and other embodiments, a precharge or reset period (during which the photosensor 221, the photosensor 231, the floating diffusion 227, and/or the floating diffusion 237 can be reset) can occur before the integration or exposure period.

At time t4, the reset signal RST is again asserted to activate the reset transistor 223 while the row select signal RS is unasserted to deactivate the row select transistor 225.

In turn, the floating diffusion 227 and the floating diffusion 237 are reset via the reset transistor 223 between time t4 and time t5.

At time t5, the reset signal RST is unasserted while the row select signal RS is asserted. As such, the reset transistor 223 is deactivated, and the row select transistor 225 is activated. In some embodiments, a second reset level signal (corresponding to charge on the floating diffusions 227 and 237 after resetting the floating diffusions 227 and 237) can be sampled and read out of the first pixel 229 onto the bitline 230 (e.g., for correlated double sampling) between time t5 and time t6. In these and other embodiments, an integration or exposure period (not illustrated) associated with photosensor 231 can occur prior to time t6.

At time t6, the transfer control signal TX_EVS is asserted, thereby activating the transfer transistor 232 of the second pixel 239. Activation of the transfer transistor 232 couples the photosensor 231 of the second pixel 239 to (i) the floating diffusion 237 of the second pixel 239 and (ii) the floating diffusion 227 of the first pixel 229. Activation of the transfer transistor 232 also allows charge photogenerated by the photosensor 231 in response to incident light to be (a) transferred to the floating diffusion 237 and the floating diffusion 227, and (b) applied to the gate of the source follower transistor 224. Because the row select signal RS remains asserted between time t5 and time t8, a second signal level signal (corresponding to image charge that was (i) photogenerated by the photosensor 231 and (ii) applied to the gate of the source follower transistor 224 between time t6 and time t7) is sampled and read out of the first pixel 229 onto the bitline 230 between time t7 and time t8. At time t7, the transfer control signal TX_EVS is unasserted, thereby deactivating the transfer transistor 232 and uncoupling the photosensor 231 from the floating diffusion 237 and the floating diffusion 227.

At time t8, the reset signal RST is again asserted to activate the reset transistor 223 while the row select signal RS is unasserted to deactivate the row select transistor 225 (e.g., to reset the charge on the floating diffusion 227 and the floating diffusion 237).

Although shown as activated for the entire duration of time between time t0 and time t8 of the timing diagram 340 shown in FIG. 3A, the first switch control signal CIS_MODE_SW can, in other embodiments, be asserted to selectively activate the first switch 236 of the mode switch circuit 235 for times between time t0 and t8 that correspond only to acquiring a CIS image signal for the second pixel 239. For example, the first switch control signal CIS_MODE_SW can be activated from time t0 to time t1 (e.g., to reset the floating diffusion 237), deactivated from time t1 to time t4, and then activated from time t4 to time t8. As another example, the first switch control signal CIS_MODE_SW can be deactivated from time t0 to time t4, and then activated from time t4 to time t8.

Additionally, or alternatively, although the first pixel 229 is shown in FIG. 3A as being read out before the second pixel 239 is read out, the second pixel 239 can, in other embodiments, be read out before the first pixel 229. As a specific example, the transfer control signal TX_EVS can be pulsed between time t2 and time t3 of FIG. 3A (as opposed to being pulsed between time t6 and time t7), and the transfer control signal TX_CIS can be pulsed between time t6 and time t7 (as opposed to being pulsed between time t2 and time t3).

Referring again to FIG. 2, when the first switch 236 of the mode switch circuit 235 is deactivated while the second switch 238 of the mode switch circuit 235 is activated, the first pixel 229 can be operated to obtain a CIS image signal while the second pixel 239 can be operated to detect events that occur in an external scene monitored by the second pixel 239. For example, an analog signal corresponding to charge accumulated on the floating diffusion 227 of the first pixel 229 can be read out onto the bitline 230 when the row select signal RS is asserted to activate the row select transistor 225, and charge accumulated on the floating diffusion 237 of the second pixel 239 can be transferred to EVS readout circuitry corresponding to the second pixel 239. Thus, activation of the second switch 238 while the first switch 236 is not activated can correspond to the hybrid CIS and EVS mode of the pixel arrangement 220.

FIG. 3B is a timing diagram 350 that corresponds to readout of the pixel arrangement 220 of FIG. 2 while the pixel arrangement 220 is operated in the hybrid CIS and EVS mode. Referring to FIGS. 2 and 3B together, at time t0, the first switch control signal CIS_MODE_SW is unasserted (such that the first switch 236 of the mode switch circuit 235 is deactivated) while the second switch control signal EVS-_MODE_SW is asserted (such that the second switch 238 of the mode switch circuit 235 is activated). In addition, the transfer control signal TX_EVS is asserted, such that (i) the transfer transistor 232 is activated and (ii) the photosensor 231 is coupled to the floating diffusion 237. Thus, the photosensor 231 and the floating diffusion 237 of the second pixel 239 can be coupled to EVS readout circuitry corresponding to the second pixel 239. As such, image charge photogenerated by the photosensor 231 can be transferred to the EVS readout circuitry to generate a contrast change (e.g., an event signal). A change in contrast above a threshold (e.g., a change in intensity of light incident on the photosensor 231 from darker to brighter and greater than a threshold, a change in intensity of light incident on the photosensor 231 from brighter to darker and greater than a threshold) can indicate an event (e.g., motion) has occurred within an external scene monitored by the second pixel 239, and can trigger the EVS readout circuitry to trigger an event detection signal that indicates that the second pixel 239 has detected an event in the scene. As shown in FIG. 3B, the first switch control signal CIS_MODE_SW can remain unasserted (meaning the first switch 236 can remain deactivated), the second switch control signal EVS_MODE_SW can remain asserted (meaning the second switch 238 can remain activated), and the transfer control signal TX_EVS can remain activated (meaning the transfer transistor 232 can remain activated) for the entire duration of time shown in the timing diagram 350. Thus, the photosensor 231 and the floating diffusion 237 of the second pixel 239 can be coupled to EVS readout circuitry corresponding to the second pixel 239 for the entire duration of time shown in FIG. 3B. In other words, the second pixel 239 can operate as an event vision pixel for the entire duration of time between time t0 and time t8 in the timing diagram 350 of FIG. 3B.

Also, at time t0 of the timing diagram 350, a reset signal RST is in an asserted state such that the reset transistor 223 is activated, and the row select signal RS is in an unasserted state such that the row select transistor 225 is deactivated. In addition, the transfer control signal TX_CIS is unasserted, such that the transfer transistor 222 of the first pixel 229 is deactivated. As such, the floating diffusion 227 of the first pixel 229 is reset via the reset transistor 223 at time t0.

At time t1, the reset signal RST is unasserted while the row select signal RS is asserted. As such, the reset transistor 223 is deactivated, and the row select transistor 225 is activated. In some embodiments, a first reset level signal (corresponding to charge on the floating diffusion 227 after resetting the floating diffusion 227) can be sampled and read out of the first pixel 229 onto the bitline 230 (e.g., for correlated double sampling) between time t1 and time t2.

At time t2, the transfer control signal TX_CIS is asserted (e.g., via a pulse high signal), thereby activating the transfer transistor 222 of the first pixel 229. Activation of the transfer transistor 222 (i) couples the photosensor 221 of the first pixel 229 to the floating diffusion 227 of the first pixel 229, and (ii) allows charge photogenerated by the photosensor 221 in response to incident light to be (a) transferred to the floating diffusion 227 and (b) applied to the gate of the source follower transistor 224. Because the row select signal RS remains asserted between time t1 and time t4, a first signal level signal (corresponding to image charge that was (i) photogenerated by the photosensor 221 and (ii) applied to the gate of the source follower transistor 224 between time t2 and time t3) is sampled and read out of the first pixel 229 onto the bitline 230 between time t3 and time t4. At time t3, the transfer control signal TX_CIS is unasserted, thereby deactivating the transfer transistor 222 and uncoupling the photosensor 221 from the floating diffusion 227 and the floating diffusion 237. As shown, the transfer control signal can remain unasserted for the remaining duration of time shown in the timing diagram 350.

At time t4, the reset signal RST is again asserted to activate the reset transistor 223 while the row select signal RS is unasserted to deactivate the row select transistor 225. In turn, the floating diffusion 227 of the first pixel 229 is reset via the reset transistor 223. As shown, the reset signal RST can remain asserted while the row select signal RS can remain unasserted for the remaining duration of time shown in the timing diagram 350.

Referring again to FIG. 2, when the first switch 236 and the second switch 238 of the mode switch circuit 235 are activated (e.g., while the row select transistor 225 and/or the reset transistor 223 are not activated), charge accumulated on both the floating diffusion 227 of the first pixel 229 and the floating diffusion 237 of the second pixel 239 can be transferred to EVS readout circuitry corresponding to the second pixel 239. Thus, activation of the first switch 236 and the second switch 238 (e.g., while the row select transistor 225 and/or the reset transistor 223 are not activated) can correspond to the EVS only mode of the pixel arrangement 220.

FIG. 3C is timing diagram 360 that corresponds to readout of the pixel arrangement 220 of FIG. 2 when the pixel arrangement 220 is operated in the EVS only mode. Referring to FIGS. 2 and 3C together, at time t0, the first switch control signal CIS_MODE_SW is asserted such that the first switch 236 of the mode switch circuit 235 is activated; the second switch control signal EVS_MODE_SW is asserted such that the second switch 238 of the mode switch circuit 235 is activated; the transfer control signal TX_CIS is asserted such that the transfer transistor 222 is activated; and the transfer control signal TX_EVS is asserted such that the transfer transistor 232 is activated. As such, the photosensor 221 and the floating diffusion 227 of the first pixel 229 are each coupled to EVS readout circuitry via the first switch 236 and the second switch 238 of the mode switch circuit 235. In addition, the photosensor 231 and the floating diffusion 237 of the second pixel 239 are each coupled to the EVS readout circuitry via the second switch 238 of the mode switch circuit 235. As shown in FIG. 3C, the states of the first switch control signal CIS_MODE_SW, the second switch control signal EVS_MODE_SW, the transfer control signal TX_CIS, and the transfer control signal TX_EVS remain unchanged for the remainder of the time shown in the timing diagram 360. Thus, the first switch 236, the second switch 238, the transfer transistor 222, and the transfer transistor 232, respectively, remain activated for the remainder of the time shown in the timing diagram 360. As also shown in FIG. 3C, the reset signal RST and the row select signal RS are unasserted at time t0 and remain unasserted for the remainder of the time shown in timing diagram 360. Therefore, the reset transistor 223 and the row select transistor 225, respectively, are deactivated at time t0 and remain deactivated for the remainder of the time shown in the timing diagram 360.

While the photosensor 221, the floating diffusion 227, the photosensor 231, and the floating diffusion 237 are coupled to the EVS readout circuitry, image charge photogenerated by the photosensor 221 and/or the photosensor 231 is transferred to the EVS readout circuitry to generate a contrast change (e.g., an event signal). A change in contrast above a threshold (e.g., a change in intensity of light incident on the photosensor 221 and/or the photosensor 231 from darker to brighter and greater than a threshold, a change in intensity of light incident on the photosensor 221 and/or the photosensor 231 from brighter to darker and greater than a threshold) can indicate an event (e.g., motion) has occurred within an external scene monitored by the first pixel 229 and/or the second pixel 239, and can trigger the EVS readout circuitry to trigger an event detection signal that indicates that the first pixel 229 and/or the second pixel 239 has detected an event in the scene.

Referring again to FIG. 2, all or a portion of the mode switch circuit 235 can be positioned on a same die (e.g., the first die 102 of FIG. 1) as the first pixel 229 and/or the second pixel 239. In some embodiments, positioning the mode switch circuit 235 on the same die as the first pixel 229 and/or the second pixel 239 can reduce an amount of transistors and/or other circuitry required to position all or a portion of a mode switch circuit on a different die (e.g., the second die 104 of FIG. 1) than the die (e.g., the first die 102) on which the first pixel 229 and/or the second pixel 239 are positioned. Additionally, or alternatively, positioning the mode switch circuit 235 on the same die as the first pixel 229 and/or the second pixel 239 can obviate the practice of routing a power supply signal (e.g., VDDAPIX, AVDD, etc.) to the different die. In other embodiments of the present technology, all or a portion of the mode switch circuit 235 (e.g., the first switch 236 and/or the second switch 238) can be positioned on a different die from the die on which the first pixel 229 and/or the second pixel 239 are positioned.

Figure 4A:
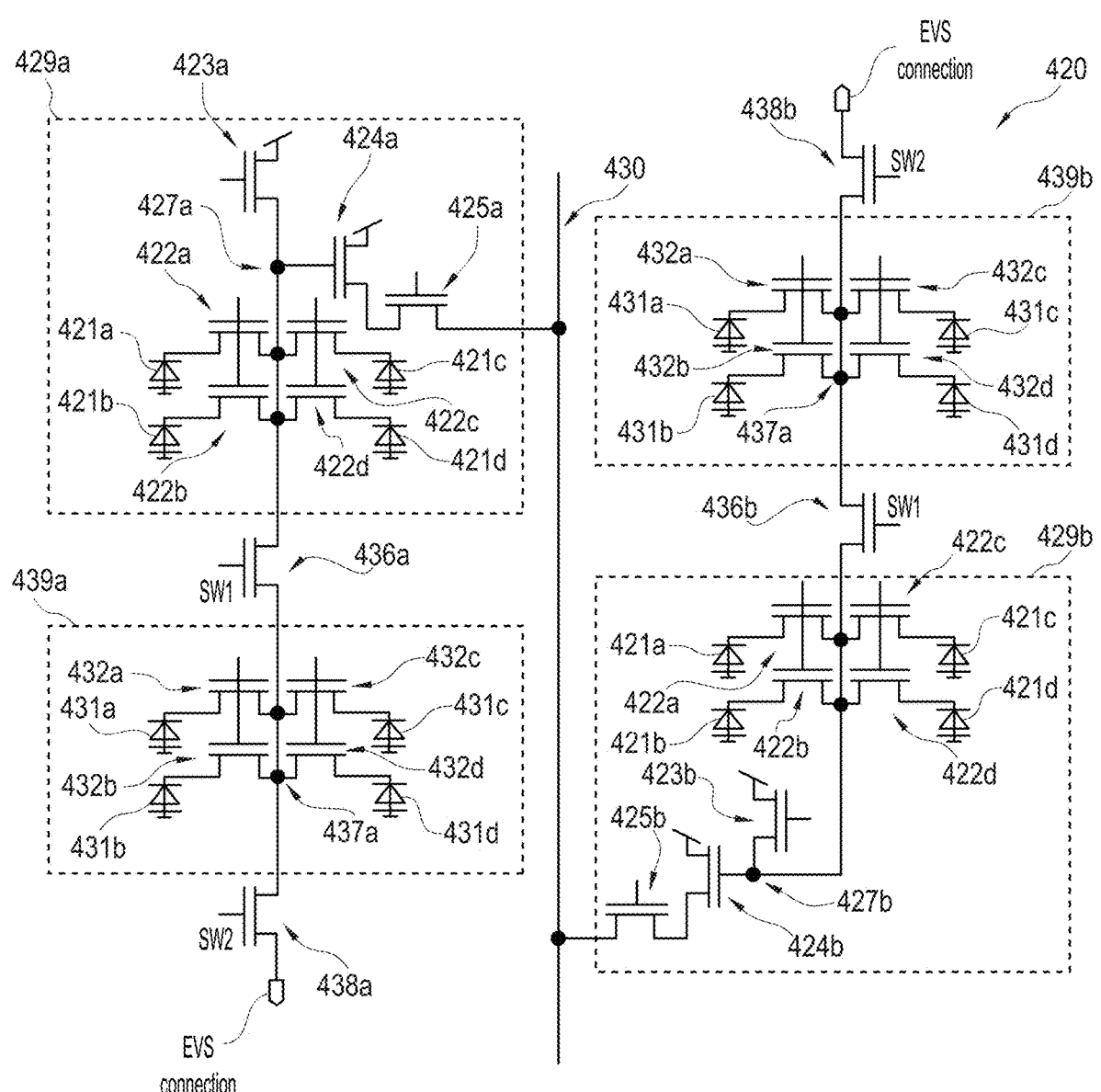
FIG. 4A is a partially schematic circuit diagram of a pixel arrangement of four pixels, the pixel arrangement configured in accordance with various embodiments of the present technology.

The principals of the present technology discussed above with reference to FIGS. 1-3C can be applied in various other image sensors, pixel arrangements, and/or pixel architectures. For example, FIG. 4A is a partially schematic circuit diagram of a pixel arrangement 420 configured in accordance with various embodiments of the present technology. As shown, the pixel arrangement 420 includes four pixels: a first pixel 429a, a second pixel 439a, a third pixel 429b, and a fourth pixel 439b. The first pixel 429a, the second pixel 439a, the third pixel 429b, and/or the fourth pixel 439b may be examples of one of the pixels of the pixel array 108 of FIG. 1, the first pixel 229 of FIG. 2, the second pixel 239 of FIG. 2, or of another pixel configured in accordance with various embodiments of the present technology. As shown, the architecture/arrangement of the first pixel 429a and the second pixel 439a and the architecture/arrangement of the third pixel 429b and the fourth pixel 439b of FIG. 4A are each generally similar to the architecture/arrangement of the first pixel 229 and the second pixel 239, respectively, of the pixel arrangement 220 of FIG. 2. Therefore, like references numbers have been used across FIGS. 2 and 4A to denote identical or at least generally similar components, and a detailed discussion of the pixel arrangement 420 is largely omitted here for the sake of brevity in light of the detailed discussion of the pixel arrangement 220 provided above.

In contrast with the first pixel 229 of the pixel arrangement 220 of FIG. 2, the first pixel 429a and the third pixel 429b of the pixel arrangement 420 of FIG. 4A each include four photosensors (identified individually as first through fourth photosensors 421a-421d) and four transfer transistors (identified individually as first through fourth transfer transistors 422a-422d). Each of the photosensors 421a-421d of the first pixel 429a is configured to photogenerate image charge (e.g., one or more electrons or holes) in response to light incident thereon. Each of the photosensors 421a-421d of the first pixel 429a is selectively coupled to a floating diffusion 427a of the first pixel 429a via a corresponding one of the transfer transistors 422a-422d of the first pixel 429a. The first and second transfer transistors 422a and 422b of the first pixel 429a are selectively activated using a first transfer control signal, and the third and fourth transfer transistors 422c and 422d of the first pixel 429a are selectively activated using a second transfer control signal. The first transfer control signal can be the same signal as—or a different signal from—the second transfer control signal. In other embodiments, each of the transfer transistors 422a-422d of the first pixel 429a can be selectively activated via a transfer control signal that is different from the transfer control signals used to selectively activate other ones of the transfer transistors 422a-422d of the first pixel 429a. Each of the photosensors 421a-421d of the first pixel 429a (alone or in combination with the corresponding one of the transfer transistors 422a-422d) are also referred to herein as a "subpixel" of the first pixel 429a.

Similarly, each of the photosensors 421a-421d of the third pixel 429b is selectively coupled to a floating diffusion 427b of the third pixel 429b via a corresponding one of the transfer transistors 422a-422d of the third pixel 429b. Each of the photosensors 421a-421d of the third pixel 429b is configured to photogenerate image charge (e.g., one or more electrons or holes) in response to light incident thereon. The first and second transfer transistors 422a and 422b of the third pixel 429b are selectively activated using a third transfer control signal, and the third and fourth transfer transistors 422c and 422d of the third pixel 429b are selectively activated using a fourth transfer control signal. The third transfer control signal can be the same signal as—or a different signal from—the fourth transfer control signal. Additionally, or alternatively, the third transfer control and/or the fourth transfer control signal can be the same signal(s) as (or different signal(s) from) the first transfer control signal and/or the second transfer control signal discussed above with reference to the first pixel 429a. In other embodiments, each of the transfer transistors 422a-422d of the third pixel 429b can be selectively activated via a transfer control signal that is different from the transfer control signals used to selectively activate other ones of the transfer transistors 422a-422d of the third pixel 429b. Each of the photosensors 421a-421d of the third pixel 429b (alone or in combination with the corresponding one of the transfer transistors 422a-422d) are also referred to herein as a "subpixel" of the third pixel 429b.

Furthermore, in contrast with the second pixel 239 of the pixel arrangement 220 of FIG. 2, the second pixel 439a and the fourth pixel 439b of the pixel arrangement 420 of FIG. 4A each include four photosensors (identified individually as first through fourth photosensors 431a-431d) and four transfer transistors (identified individually as first through fourth transfer transistors 432a-432d). Each of the photosensors 431a-431d of the second pixel 439a is selectively coupled to a floating diffusion 437a of the second pixel 439a via a corresponding one of the transfer transistors 432a-432d of the second pixel 439a. Each of the photosensors 431a-431d of the second pixel 439a is configured to photogenerate image charge (e.g., one or more electrons or holes) in response to light incident thereon. The first and second transfer transistors 432a and 432b of the second pixel 439a are selectively activated using a fifth transfer control signal, and the third and fourth transfer transistors 432c and 432d of the second pixel 439a are selectively activated using a sixth transfer control signal. The fifth transfer control signal can be the same signal as—or a different signal from—the sixth transfer control signal. Additionally, or alternatively, the fifth transfer control and/or the sixth transfer control signal can be the same signal(s) as (or different signal(s) from) the first transfer control signal, the second transfer control signal, the third transfer control signal, and/or the fourth transfer control signal discussed above with reference to the first pixel 429a and/or to the third pixel 429b. In other embodiments, each of the transfer transistors 432a-432d of the second pixel 439a can be selectively activated via a transfer control signal that is different from the transfer control signals used to selectively activate other ones of the transfer transistors 432a-432d of the second pixel 439a. Each of the photosensors 431a-431d of the second pixel 439a (alone or in combination with the corresponding one of the transfer transistors 432a-432d) are also referred to herein as a "subpixel" of the second pixel 439a.

Similarly, each of the photosensors 431a-431d of the fourth pixel 439b is selectively coupled to a floating diffusion 437b of the fourth pixel 439b via a corresponding one of the transfer transistors 432a-432d of the fourth pixel 439b. Each of the photosensors 431a-431d of the fourth pixel 439b is configured to photogenerate image charge (e.g., one or more electrons or holes) in response to light incident thereon. The first and second transfer transistors 432a and 432b of the fourth pixel 439b are selectively activated using a seventh transfer control signal, and the third and fourth transfer transistors 432c and 432d of the fourth pixel 439b are selectively activated using an eighth transfer control signal. The seventh transfer control signal can be the same signal as—or a different signal from—the eighth transfer control signal. Additionally, or alternatively, the seventh transfer control and/or the eighth transfer control signal can be the same signal(s) as (or different signal(s) from) the first transfer control signal, the second transfer control signal, the third transfer control signal, the fourth transfer control signal, the fifth transfer control signal, and/or the sixth transfer control signal discussed above with reference to the first pixel 429a, the third pixel 429b, and/or the second pixel 439a. In other embodiments, each of the transfer transistors 432a-432d of the fourth pixel 439b can be selectively activated via a transfer control signal that is different from the transfer control signals used to selectively activate other ones of the transfer transistors 432a-432d of the fourth pixel 439b. Each of the photosensors 431a-431d of the fourth pixel 439b (alone or in combination with the corresponding one of the transfer transistors 432a-432d) are also referred to herein as a "subpixel" of the fourth pixel 439b.

Similar to the pixel arrangement 220 of FIG. 2, the pixel arrangement 420 of FIG. 4A can include a mode switch that facilitates operating the pixel arrangement 420 in any one of the three different modes: a CIS only mode, a hybrid CIS and EVS mode, and an EVS only mode. For example, in the illustrated embodiment, the mode switch includes a first switch 436a, a second switch 438a, a third switch 436b, and a fourth switch 438b. The first switch 436a and the second switch 438a are arranged with respect to the first pixel 429a and the second pixel 439a in a manner generally similar to how the first switch 236 and the second switch 238 of the mode switch circuit 235 of FIG. 2 are arranged with respect to the first pixel 229 and the second pixel 239 of FIG. 2. In addition, the third switch 436b and the fourth switch 438b are arranged with respect to the third pixel 429b and the fourth pixel 439b in a manner generally similar to how the first switch 236 and the second switch 238 of the mode switch circuit 235 of FIG. 2 are arranged with respect to the first pixel 229 and the second pixel 239 of FIG. 2. Therefore, a detailed discussion of the first switch 436a, the second switch 438a, the third switch 436b, and the fourth switch 438b is largely omitted here for the sake of brevity in light of the detailed discussion of the first switch 236 and the second switch 238 of the mode switch circuit 235 provided above.

As shown in FIG. 4A, the first switch 436a and the third switch 436b are configured to receive a first switch control signal SW1. As such, the first switch 436a and the third switch 436b are configured to be selectively activated based at least in part on the first switch control signal SW1. Additionally, or alternatively, the second switch 438a and the fourth switch 438b are configured to receive a second switch control signal SW2. Thus, the second switch 438a and the fourth switch 438b are configured to be selectively activated based at least in part on the second switch control signal SW2.

Figures 4B, 4C, 4D, 4E:
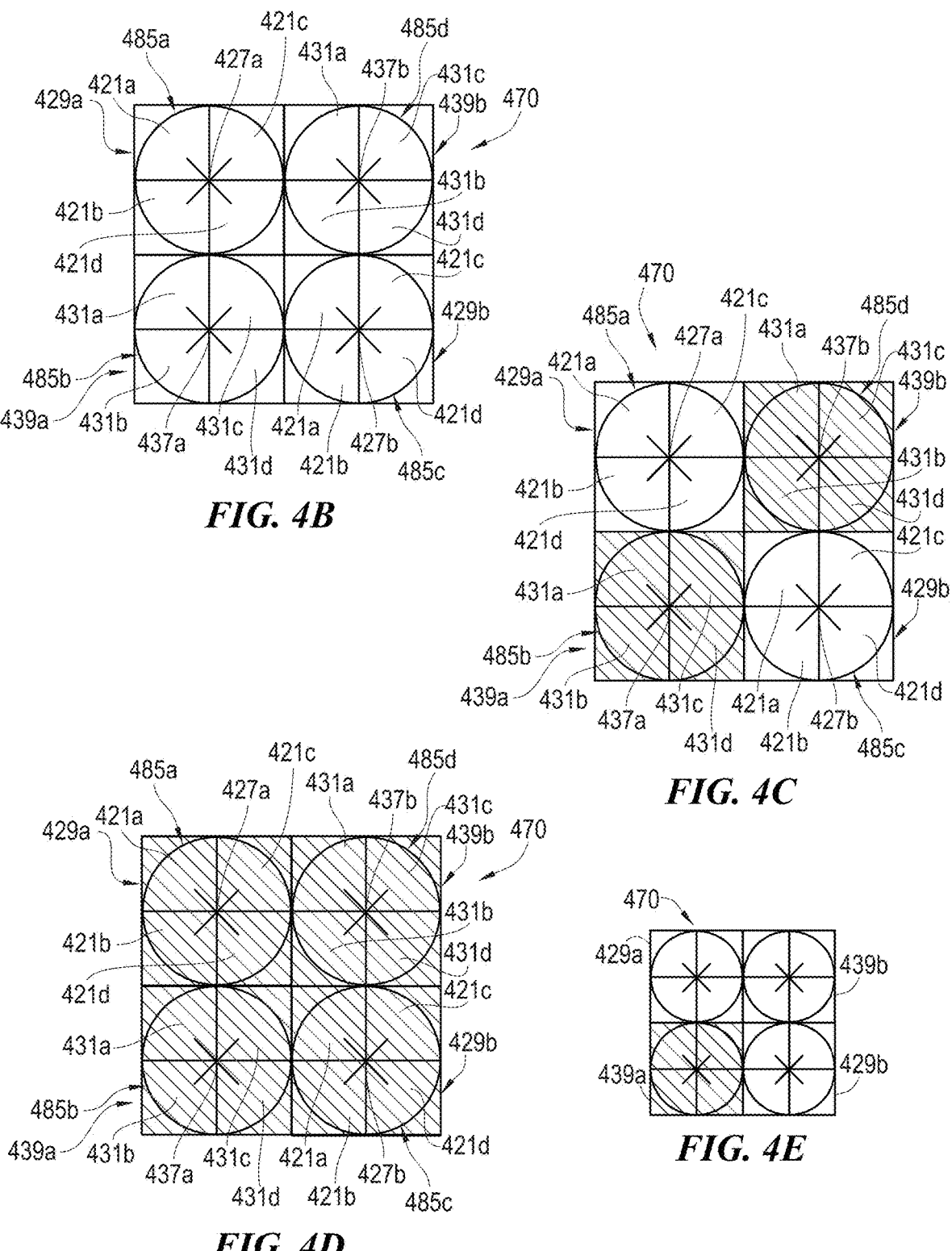
FIGS. 4B-4Q are partially schematic diagrams of a pixel array corresponding to the pixel arrangement of FIG. 4A and configured in accordance with various embodiments of the present technology.

FIGS. 4B-4D are partially schematic diagrams of a 2×2 pixel array 470 that corresponds to the pixel arrangement 420 of FIG. 4A. In particular, the pixel array 470 in each of FIGS. 4B-4D illustrates one of the operating modes of the pixel arrangement 420. For example, the pixel array 470 shown in FIG. 4B illustrates the CIS only mode of the pixel arrangement 420 in which the first pixel 429a, the second pixel 439a, the third pixel 429b, and the fourth pixel 439b can each be used to capture CIS information (e.g., a CIS image signal), such as without image quality loss compared to conventional CIS-only pixel arrays. In some embodiments, the first pixel 429a, the second pixel 439a, the third pixel 429b, and the fourth pixel 439b can be of same color (e.g., arranged under a color filter having a same spectral response). In these and other embodiments, to place the pixel arrangement 420 of FIG. 4A in the CIS only mode illustrated by the array 470 shown in FIG. 4B, the first switch control signal SW1 can be asserted (thereby activating the first switch 436a and the third switch 436b of the mode switch of the pixel arrangement 420) while the second switch control signal SW2 is not asserted (thereby deactivating the second switch 438a and the fourth switch 438b of the mode switch). Operation of the pixel arrangement 420 in the CIS only mode can be generally similar to operation of the pixel arrangement 220 of FIG. 2 in the CIS only mode described in detail above with reference to FIGS. 2 and 3A. Therefore, a detail discussion of the CIS only mode of the pixel arrangement 420 is omitted here for the sake of brevity.

The pixel array 470 shown in FIG. 4C illustrates the hybrid CIS and EVS mode of the pixel arrangement 420 of FIG. 4A in which the first pixel 429a and the third pixel 429b are used to capture CIS information (e.g., CIS image signals), and the second pixel 439a and the fourth pixel 439b are used to capture non-CIS information (e.g., event signals, event detection, phase detection auto-focus, etc.). Thus, when the pixel arrangement 420 is operated in the hybrid CIS and EVS mode, the pixel array 470 can simultaneously provide CIS information (e.g., from the first pixel 429a and the third pixel 429b) and non-CIS information (e.g., from the second pixel 439a and the fourth pixel 439b). In some embodiments, to place the pixel arrangement 420 of FIG. 4A in the hybrid CIS and EVS mode illustrated by the array 470 shown in FIG. 4C, the second switch control signal SW2 can be asserted (thereby activating the second switch 438a and the fourth switch 438b of the mode switch of the pixel arrangement 420) while the first switch control signal SW1 is not asserted (thereby deactivating the first switch 436a and the third switch 436b of the mode switch). Operation of the pixel arrangement 420 in the hybrid CIS and EVS mode can be generally similar to operation of the pixel arrangement 220 of FIG. 2 in the hybrid CIS and EVS mode described in detail above with reference to FIGS. 2 and 3B. Therefore, a detail discussion of the hybrid CIS and EVS mode of the pixel arrangement 420 is omitted here for the sake of brevity.

The pixel array 470 shown in FIG. 4D illustrates the EVS only mode of the pixel arrangement 420 of FIG. 4A in which the first pixel 429a, the second pixel 439a, the third pixel 429b, and the fourth pixel 439b are each used to capture non-CIS information (e.g., event signals, event detection, phase detection auto-focus, etc.). In some embodiments, to place the pixel arrangement 420 of FIG. 4A in the EVS only mode illustrated by the array 470 shown in FIG. 4D, both the first switch control signal SW1 and the second switch control signal SW2 can be asserted, thereby activating (a) the first switch 436a and the third switch 436b and (b) the second switch 438a and the fourth switch 438b, respectively, of the mode switch of the pixel arrangement 420. Operation of the pixel arrangement 420 in the EVS only mode can be generally similar to operation of the pixel arrangement 220 of FIG. 2 in the EVS only mode described in detail above with reference to FIGS. 2 and 3C. Therefore, a detail discussion of the EVS only mode of the pixel arrangement 420 is omitted here for the sake of brevity.

Referring again to FIG. 4A, the first switch signal SW1 is shown as used to control both the first switch 436a and the third switch 436b, and the second switch signal SW2 is shown as used to control both the second switch 438a and the fourth switch 438b. In other embodiments, the first switch 436a can be configured to receive a different switch control signal from the third switch 436b. In these and other embodiments, the second switch 438a can be configured to receive a different switch control signal from the fourth switch 438b. Using different switch control signals can facilitate independently activating the first switch 436a, the second switch 438a, the third switch 436b, and/or the fourth switch 438b, which can allow an even greater number of possibilities for operating the pixel arrangement 420 of FIG. 4A in a hybrid CIS and EVS mode. Several of these other possibilities are shown in FIGS. 4E-4J, which are partially schematic diagrams of the 2×2 pixel array 470 that corresponds to the pixel arrangement 420 of FIG. 4A.

For example, the pixel array 470 shown in FIG. 4E illustrates one possibility for a hybrid CIS and EVS mode of the pixel arrangement 420 of FIG. 4A in which the first pixel 429a, the third pixel 429b, and the fourth pixel 439b are used to capture CIS image signals, and the second pixel 439a is used to capture event signals. In some embodiments, to place the pixel arrangement 420 of FIG. 4A in the hybrid CIS and EVS mode illustrated by the array 470 shown in FIG. 4E, the second switch 438a and the third switch 436b of the mode switch of the pixel arrangement 420 can be activated while the first switch 436a and the fourth switch 438b of the mode switch are deactivated such that both CIS and non-CIS information (e.g., change in intensity or event information) can be obtained without sacrificing too much of color pixel information in exchange for EVS functionality in accordance with the teachings of the present disclosure.

Figures 4F, 4G, 4H, 4I, 4J, 4K, 4L, 4M, 4N, 4O, 4P, 4Q:
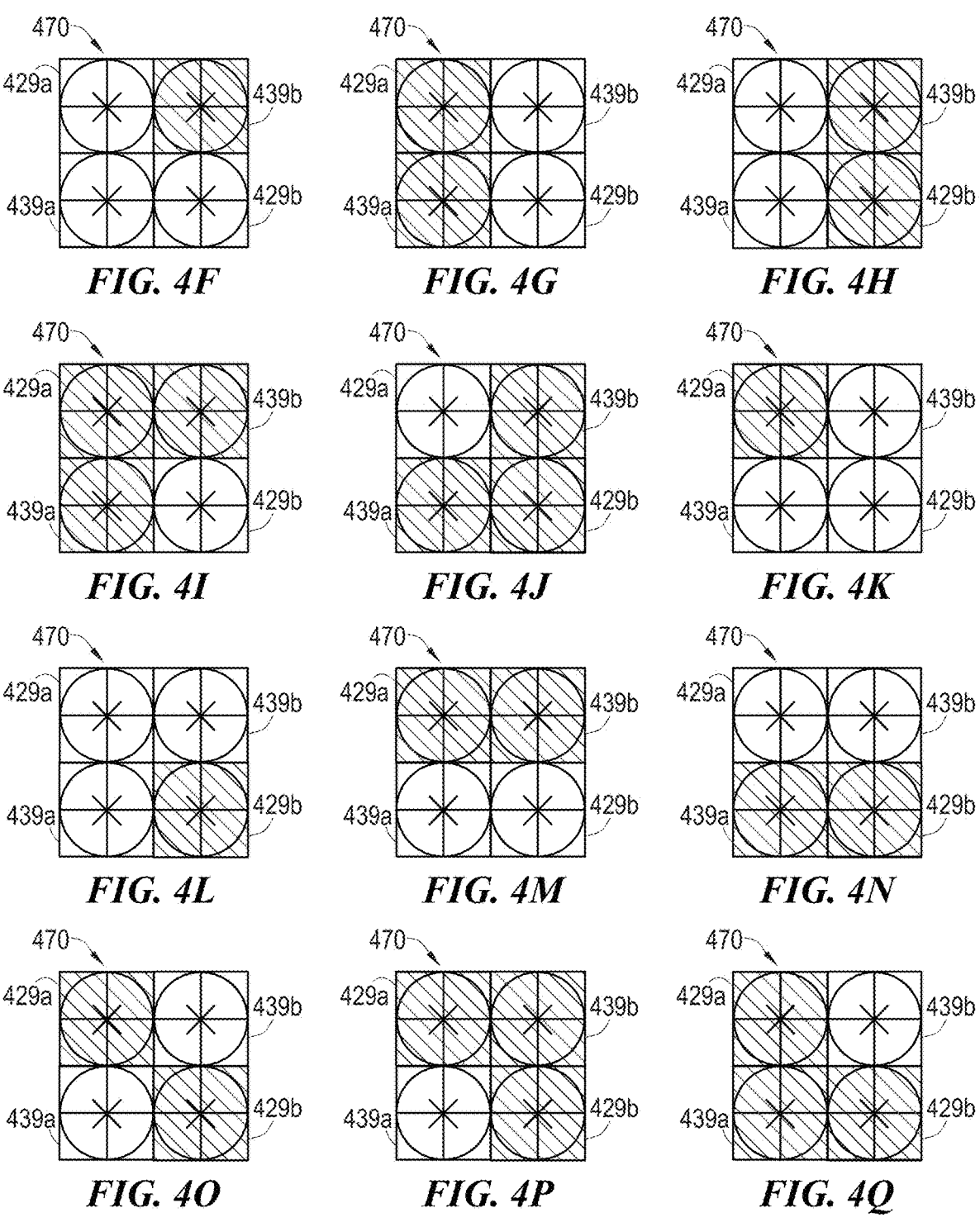

The pixel array 470 shown in FIG. 4F illustrates another possibility for a hybrid CIS and EVS mode of the pixel arrangement 420 of FIG. 4A in which the first pixel 429a, the second pixel 439a, and the third pixel 429b are used to capture CIS image signals, and the fourth pixel 439b is used to capture event signals. In some embodiments, to place the pixel arrangement 420 of FIG. 4A in the hybrid CIS and EVS mode illustrated by the array 470 shown in FIG. 4F, the first switch 436a and the fourth switch 438b of the mode switch of the pixel arrangement 420 can be activated while the second switch 438a and the third switch 436b of the mode switch are deactivated such that both CIS and non-CIS information (e.g., change in intensity or event information) can be obtained without degrading image quality (e.g., not all color pixels are sacrificed for EVS functionality).

The pixel array 470 shown in FIG. 4G illustrates still another possibility for a hybrid CIS and EVS mode of the pixel arrangement 420 of FIG. 4A in which the third pixel 429b and the fourth pixel 439b are used to capture CIS image signals, and the first pixel 429a and the second pixel 439a are used to capture event signals. In some embodiments, to place the pixel arrangement 420 of FIG. 4A in the hybrid CIS and EVS mode illustrated by the array 470 shown in FIG. 4G, the first switch 436a, the second switch 438a, and the third switch 436b of the mode switch of the pixel arrangement 420 can be activated while the fourth switch 438b of the mode switch is deactivated such that both CIS and non-CIS information (e.g., change in intensity or event information) can be obtained without sacrificing too much of color pixel information in exchange for EVS functionality in accordance with the teachings of the present disclosure.

The pixel array 470 shown in FIG. 4H illustrates yet another possibility for a hybrid CIS and EVS mode of the pixel arrangement 420 of FIG. 4A in which the first pixel 429a and the second pixel 439a are used to capture CIS image signals, and the third pixel 429b and the fourth pixel 439b are used to capture event signals. In some embodiments, to place the pixel arrangement 420 of FIG. 4A in the hybrid CIS and EVS mode illustrated by the array 470 shown in FIG. 4H, the first switch 436a, the third switch 436b, and the fourth switch 438b of the mode switch of the pixel arrangement 420 can be activated while the second switch 438a of the mode switch is deactivated such that both CIS and non-CIS information (e.g., change in intensity or event information) can be obtained without sacrificing too much of color pixel information in exchange for EVS functionality in accordance with the teachings of the present disclosure.

The pixel array 470 shown in FIG. 4I illustrates another possibility for a hybrid CIS and EVS mode of the pixel arrangement 420 of FIG. 4A in which the first pixel 429a, the second pixel 439a, and the fourth pixel 439b are used to capture CIS image signals, and the third pixel 429b is used to capture event signals. In some embodiments, to place the pixel arrangement 420 of FIG. 4A in the hybrid CIS and EVS mode illustrated by the array 470 shown in FIG. 4I, the first switch 436a, the second switch 438a, and the fourth switch 438b of the mode switch of the pixel arrangement 420 can be activated while the third switch 436b of the mode switch is deactivated such that both CIS and non-CIS information (e.g., change in intensity or event information) can be obtained without sacrificing too much of color pixel information in exchange for EVS functionality in accordance with the teachings of the present disclosure.

The pixel array 470 shown in FIG. 4J illustrates still another possibility for a hybrid CIS and EVS mode of the pixel arrangement 420 of FIG. 4A in which the second pixel 439*a*, the third pixel 429*b*, and the fourth pixel 439*b* are used to capture CIS image signals, and the first pixel 429*a* is used to capture event signals. In some embodiments, to place the pixel arrangement 420 of FIG. 4A in the hybrid CIS and EVS mode illustrated by the array 470 shown in FIG. 4J, second switch 438*a*, the third switch 436*b*, and the fourth switch 438*b* of the mode switch of the pixel arrangement 420 can be activated while the first switch 436*a* of the mode switch is deactivated such that both CIS and non-CIS information (e.g., change in intensity or event information) can be obtained without sacrificing too much of color pixel information in exchange for EVS functionality in accordance with the teachings of the present disclosure.

In some embodiments, the transfer transistors 422*a*-422*d* of the first pixel 429*a*, the transfer transistors 432*a*-432*d* of the second pixel 439*a*, the transfer transistors 422*a*-422*d* of the third pixel 429*b*, and/or the transfer transistors 432*a*-432*d* of the fourth pixel 439*b* can be leveraged to achieve even further possibilities for a hybrid CIS and EVS mode of the pixel arrangement 420 of FIG. 4A, several of which are shown in FIGS. 4K-4Q. For example, the pixel array 470 shown in FIG. 4K illustrates a possibility for a hybrid CIS and EVS mode of the pixel arrangement 420 of FIG. 4A in which the second pixel 439*a*, the third pixel 429*b*, and the fourth pixel 439*b* are used to capture CIS image signals, and the first pixel 429*a* is used to capture event signals. In some embodiments, to place the pixel arrangement 420 of FIG. 4A in the hybrid CIS and EVS mode illustrated by the array 470 shown in FIG. 4K, the first switch 436*a*, the second switch 438*a*, and the third switch 436*b* of the mode switch of the pixel arrangement 420 can be activated while (i) the fourth switch 438*b* is deactivated and (ii) the transfer transistors 432*a*-432*d* of the second pixel 439*a* are deactivated. When an image signal corresponding to image charge generated by the photosensors 431*a*-431*d* of the second pixel 439*a* is to be readout onto the bitline 430, the first switch 436*a* of the mode switch and the transfer transistors 432*a*-432*d* of the second pixel 439*a* can be activated while the transfer transistors 422*a*-422*d* of the first pixel 429*a* and the second switch 438*a* of the mode switch are deactivated.

The pixel array 470 shown in FIG. 4L illustrates another possibility for a hybrid CIS and EVS mode of the pixel arrangement 420 of FIG. 4A in which the first pixel 429*a*, the second pixel 439*a*, and the fourth pixel 439*b* are used to capture CIS image signals, and the third pixel 429*b* is used to capture event signals. In some embodiments, to place the pixel arrangement 420 of FIG. 4A in the hybrid CIS and EVS mode illustrated by the array 470 shown in FIG. 4L, the first switch 436*a*, the third switch 436*b*, and the fourth switch 438*b* of the mode switch of the pixel arrangement 420 can be activated while (i) the second switch 438*a* is deactivated and (ii) the transfer transistors 432*a*-432*d* of the fourth pixel 439*b* are deactivated. When an image signal corresponding to image charge generated by the photosensors 431*a*-431*d* of the fourth pixel 439*b* is to be readout onto the bitline 430, the third switch 436*b* of the mode switch and the transfer transistors 432*a*-432*d* of the fourth pixel 439*b* can be activated while the transfer transistors 422*a*-422*d* of the third pixel 429*b* and the fourth switch 438*b* of the mode switch are deactivated.

The pixel array 470 shown in FIG. 4M illustrates still another possibility for a hybrid CIS and EVS mode of the pixel arrangement 420 of FIG. 4A in which the second pixel 439*a* and the third pixel 429*b* are used to capture CIS image signals, and the first pixel 429*a* and fourth pixel 439*b* are used to capture event signals. In some embodiments, to place the pixel arrangement 420 of FIG. 4A in the hybrid CIS and EVS mode illustrated by the array 470 shown in FIG. 4M, the first switch 436*a*, the second switch 438*a*, and the fourth switch 438*b* of the mode switch of the pixel arrangement 420 can be activated while (i) the third switch 436*b* is deactivated and (ii) the transfer transistors 432*a*-432*d* of the second pixel 439*a* are deactivated. When an image signal corresponding to image charge generated by the photosensors 431*a*-431*d* of the second pixel 439*a* is to be readout onto the bitline 430, the first switch 436*a* of the mode switch and the transfer transistors 432*a*-432*d* of the second pixel 439*a* can be activated while the transfer transistors 422*a*-422*d* of the first pixel 429*a* and the second switch 438*a* of the mode switch are deactivated.

The pixel array 470 shown in FIG. 4N illustrates yet another possibility for a hybrid CIS and EVS mode of the pixel arrangement 420 of FIG. 4A in which the first pixel 429*a* and the fourth pixel 439*b* are used to capture CIS image signals, and the second pixel 439*a* and the third pixel 429*b* are used to capture event signals. In some embodiments, to place the pixel arrangement 420 of FIG. 4A in the hybrid CIS and EVS mode illustrated by the array 470 shown in FIG. 4N, the second switch 438*a*, the third switch 436*b*, and the fourth switch 438*b* of the mode switch of the pixel arrangement 420 can be activated while (i) the first switch 436*a* is deactivated and (ii) the transfer transistors 432*a*-432*d* of the fourth pixel 439*b* are deactivated. When an image signal corresponding to image charge generated by the photosensors 431*a*-431*d* of the fourth pixel 439*b* is to be readout onto the bitline 430, the third switch 436*b* of the mode switch and the transfer transistors 432*a*-432*d* of the fourth pixel 439*b* can be activated while the transfer transistors 422*a*-422*d* of the third pixel 429*b* and the fourth switch 438*b* of the mode switch are deactivated.

The pixel array 470 shown in FIG. 4O illustrates another possibility for a hybrid CIS and EVS mode of the pixel arrangement 420 of FIG. 4A in which the second pixel 439*a* and the fourth pixel 439*b* are used to capture CIS image signals, and the first pixel 429*a* and the third pixel 429*b* are used to capture event signals. In some embodiments, to place the pixel arrangement 420 of FIG. 4A in the hybrid CIS and EVS mode illustrated by the array 470 shown in FIG. 4), the first switch 436*a*, the second switch 438*a*, the third switch 436*b*, and the fourth switch 438*b* of the mode switch of the pixel arrangement 420 can be activated while (i) the transfer transistors 432*a*-432*d* of the second pixel 439*a* and (ii) the transfer transistors 432*a*-432*d* of the fourth pixel 439*b* are deactivated. When an image signal corresponding to image charge generated by the photosensors 431*a*-431*d* of the second pixel 439*a* is to be readout onto the bitline 430, the first switch 436*a* of the mode switch and the transfer transistors 432*a*-432*d* of the second pixel 439*a* can be activated while the transfer transistors 422*a*-422*d* of the first pixel 429*a* and the second switch 438*a* of the mode switch are deactivated. Similarly, when an image signal corresponding to image charge generated by the photosensors 431*a*-431*d* of the fourth pixel 439*b* is to be readout onto the bitline 430, the third switch 436*b* of the mode switch and the transfer transistors 432*a*-432*d* of the fourth pixel 439*b* can be activated while the transfer transistors 422a-422d of the third pixel 429b and the fourth switch 438b of the mode switch are deactivated.

The pixel array 470 shown in FIG. 4P illustrates still another possibility for a hybrid CIS and EVS mode of the pixel arrangement 420 of FIG. 4A in which the second pixel 439a is used to capture CIS image signals, and the first pixel 429a, the third pixel 429b, and the fourth pixel 439b are used to capture event signals. In some embodiments, to place the pixel arrangement 420 of FIG. 4A in the hybrid CIS and EVS mode illustrated by the array 470 shown in FIG. 4P, the first switch 436a, the second switch 438a, the third switch 436b, and the fourth switch 438b of the mode switch of the pixel arrangement 420 can be activated while (i) the transfer transistors 432a-432d of the second pixel 439a are deactivated. When an image signal corresponding to image charge generated by the photosensors 431a-431d of the second pixel 439a is to be readout onto the bitline 430, the first switch 436a of the mode switch and the transfer transistors 432a-432d of the second pixel 439a can be activated while the transfer transistors 422a-422d of the first pixel 429a and the second switch 438a of the mode switch are deactivated.

The pixel array 470 shown in FIG. 4Q illustrates yet another possibility for a hybrid CIS and EVS mode of the pixel arrangement 420 of FIG. 4A in which the fourth pixel 439b is used to capture CIS image signals, and the first pixel 429a, the second pixel 439a, and the third pixel 429b are used to capture event signals. In some embodiments, to place the pixel arrangement 420 of FIG. 4A in the hybrid CIS and EVS mode illustrated by the array 470 shown in FIG. 4Q, the first switch 436a, the second switch 438a, the third switch 436b, and the fourth switch 438b of the mode switch of the pixel arrangement 420 can be activated while (i) the transfer transistors 432a-432d of fourth pixel 439b are deactivated. When an image signal corresponding to image charge generated by the photosensors 431a-431d of the fourth pixel 439b is to be readout onto the bitline 430, the third switch 436b of the mode switch and the transfer transistors 432a-432d of the fourth pixel 439b can be activated while the transfer transistors 422a-422d of the third pixel 429b and the fourth switch 438b of the mode switch are deactivated.

Referring again to FIG. 4B, the first pixel 429a, the second pixel 439a, the third pixel 429b, and the fourth pixel 439b of the pixel array 470 can each include a respective microlens 485a-485d positioned over its respective photosensors 421a-421d and 431a-431d. In other embodiments, a microlens can be shared between two or more of the first pixel 429a, the second pixel 439a, the third pixel 429b, and/or the fourth pixel 439b. Additionally, or alternatively, the first pixel 429a, the second pixel 439a, the third pixel 429b, and/or the fourth pixel 439b can each include a color filter over its respective photosensors 421a-421d and 431a-431d. In other embodiments, a color filter can be shared between two or more of the first pixel 429a, the second pixel 439a, the third pixel 429b, and/or the fourth pixel 439b. Some of the color filters can be configured to pass light corresponding to a specific color or a specific range of light wavelengths (e.g., red, green, blue, or a non-RGB color) through to the photosensors 421a-421d and/or 431a-431d positioned beneath the color filter. Additionally, or alternatively, some of the color filters can be clear such that all light incident on the color filter can pass through the color filter and strike the photosensors 421a-421d and/or 431a-431d positioned beneath the color filter.

FIG. 5A is a partially schematic circuit diagram of another pixel arrangement 520 configured in accordance with various embodiments of the present technology. As shown, the pixel arrangement 520 includes two pixels: a first pixel 529 and a second pixel 539. The first pixel 529 and/or the second pixel 539 may be examples of one of the pixels of the pixel array 108 of FIG. 1; the first pixel 229 of FIG. 2; the second pixel 239 of FIG. 2; one or more of the pixels 429a, 429b, 439a, and/or 439b of FIG. 4A, or of another pixel configured in accordance with various embodiments of the present technology. As shown, the architecture/arrangement of the first pixel 529 and the second pixel 539 are each generally similar to the architecture/arrangement of the first pixel 429a and the second pixel 439a, respectively, of the pixel arrangement 420 of FIG. 4A except that the first pixel 529 and the second pixel 539 of the pixel arrangement 520 are arranged horizontally with respect to one another instead of vertically with respect to one another. Therefore, like references numbers have been used across FIGS. 4A and 5A to denote identical or at least generally similar components, and a detailed discussion of the pixel arrangement 520 is largely omitted here for the sake of brevity in light of the detailed discussion of the pixel arrangement 420 provided above.

Similar to the pixel arrangement 420 of FIG. 4A, the pixel arrangement 520 of FIG. 5A can include a mode switch that facilitates operating the pixel arrangement 520 in any one of the three different modes: a CIS only mode, a hybrid CIS and EVS mode, and an EVS only mode. For example, in the illustrated embodiment, the mode switch includes a first switch 536 and a second switch 538. The first switch 536 and the second switch 538 are arranged with respect to the first pixel 529 and the second pixel 539 in a manner generally similar to how the first switch 436a and the second switch 438a of the mode switch circuit of the pixel arrangement 420 of FIG. 4A are arranged with respect to the first pixel 429a and the second pixel 439a of FIG. 4A. Therefore, a detailed discussion of the first switch 536 and the second switch 538 is largely omitted here for the sake of brevity in light of the detailed discussion of the first switch 436a and the second switch 438a of the mode switch circuit of the pixel arrangement 420 provided above.

As shown in FIG. 5A, the first switch 536 is configured to receive a first switch control signal SW1. As such, the first switch 536 is configured to be selectively activated based at least in part on the first switch control signal SW1. Additionally, or alternatively, the second switch 538 is configured to receive a second switch control signal SW2. Thus, the second switch 538 is configured to be selectively activated based at least in part on the second switch control signal SW2.

FIGS. 5B-5D are partially schematic diagrams of a 1×2 pixel array 570 that corresponds to the pixel arrangement 520 of FIG. 5A. In particular, the pixel array 570 in each of FIGS. 5B-5D illustrates one of the operating modes of the pixel arrangement 520. For example, the pixel array 570 shown in FIG. 5B illustrates the CIS only mode of the pixel arrangement 520 in which the first pixel 529 and the second pixel 539 can each be used to capture a CIS image signal. In some embodiments, to place the pixel arrangement 520 of FIG. 5A in the CIS only mode illustrated by the array 570 shown in FIG. 5B, the first switch control signal SW1 can be asserted (thereby activating the first switch 536 of the mode switch of the pixel arrangement 520) while the second switch control signal SW2 is not asserted (thereby deactivating the second switch 538 of the mode switch). Operation of the pixel arrangement 520 in the CIS only mode can be generally similar to operation of the pixel arrangement 220 of FIG. 2 in the CIS only mode described in detail above with reference to FIGS. 2 and 3A. Therefore, a detail discussion of the CIS only mode of the pixel arrangement 520 is omitted here for the sake of brevity.

The pixel array 570 shown in FIG. 5C illustrates the hybrid CIS and EVS mode of the pixel arrangement 520 of FIG. 5A in which the first pixel 529 is used to capture CIS image signals, and the second pixel 539 is used to capture event signals. In some embodiments, to place the pixel arrangement 520 of FIG. 5A in the hybrid CIS and EVS mode illustrated by the array 570 shown in FIG. 5C, the second switch control signal SW2 can be asserted (thereby activating the second switch 538 of the mode switch of the pixel arrangement 520) while the first switch control signal SW1 is not asserted (thereby deactivating the first switch 536 of the mode switch). Operation of the pixel arrangement 520 in the hybrid CIS and EVS mode can be generally similar to operation of the pixel arrangement 220 of FIG. 2 in the hybrid CIS and EVS mode described in detail above with reference to FIGS. 2 and 3B. Therefore, a detail discussion of the hybrid CIS and EVS mode of the pixel arrangement 520 is omitted here for the sake of brevity.

The pixel array 570 shown in FIG. 5D illustrates the EVS only mode of the pixel arrangement 520 of FIG. 5A in which the first pixel 529 and the second pixel 539 are each used to capture event signals. In some embodiments, to place the pixel arrangement 520 of FIG. 5A in the EVS only mode illustrated by the array 570 shown in FIG. 5D, both the first switch control signal SW1 and the second switch control signal SW2 can be asserted, thereby activating the first switch 536 and the second switch 538, respectively, of the mode switch of the pixel arrangement 520. Operation of the pixel arrangement 520 in the EVS only mode can be generally similar to operation of the pixel arrangement 220 of FIG. 2 in the EVS only mode described in detail above with reference to FIGS. 2 and 3C. Therefore, a detail discussion of the EVS only mode of the pixel arrangement 520 is omitted here for the sake of brevity.

Referring again to FIG. 5B, the first pixel 529 can include a first microlens 585a over two of its photosensors (e.g., first photosensor 521a and third photosensor 521c) and a second microlens 585b over two other of its photosensors (e.g., second photosensor 521b and fourth photosensor 521d). Similarly, the second pixel 539 can include a third microlens 585c over two of its photosensors (e.g., first photosensor 531a and third photosensor 531c) and a fourth microlens 585d over two other of its photosensors (e.g., second photosensor 531b and fourth photosensor 531d). Each of the photosensors 521a-521d of the first pixel 529 is configured to photogenerate image charge (e.g., one or more electrons or holes) in response to light directed thereto by a corresponding microlens (e.g., the first microlens 585a or the second microlens 585b). Each of the photosensors 531a-531d of the second pixel 539 is configured to photogenerate image charge (e.g., one or more electrons or holes) in response to light directed thereto by a corresponding microlens (e.g., the third microlens 585c or the fourth microlens 585d). Additionally, or alternatively, the first pixel 529 and/or the second pixel 539 can each include one or more color filters positioned over its respective photosensors 521a-521d and/or 531a-531d, respectively. In other embodiments, a color filter can be shared between the first pixel 529 and the second pixel 539. Some of the color filters can be configured to pass light corresponding to a specific color (e.g., red, green, blue, or a non-RGB color) through to the photosensors 521a-521d and/or 531a-531d positioned beneath the color filter. Additionally, or alternatively, some of the color filters can be clear such that all light incident on the color filter can pass through the color filter and strike the photosensors 521a-521d and/or 531a-531d positioned beneath the color filter.

FIGS. 2 and 5A discussed above are directed to horizontal pixel arrangements 220 and 520, respectively, of two pixels, with the first pixel positioned to the left of the second pixel. In other pixel arrangements of the present technology, the first pixel can be positioned to the right of the second pixel. In addition, FIG. 4A is directed to a pixel arrangement 420 of four pixels in which similar pixels (e.g., first pixel 429a and third pixel 429b, and second pixel 439a and fourth pixel 439b) are arranged diagonally from one another. Other pixel arrangements of any number of pixels are of course possible and within the scope of the present technology. FIGS. 6-9 are partially schematic diagrams that illustrate various examples of these other pixel arrangements. For example, FIG. 6 is a partially schematic diagram of a pixel arrangement 670 configured in accordance with various embodiments of the present technology. As shown, the pixel arrangement 670 includes four pixels: a first pixel 629a, a second pixel 639a, a third pixel 629b, and a fourth pixel 639b. In the pixel arrangement 670, similar pixels (e.g., first pixel 629a and third pixel 629b, and second pixel 639a and fourth pixel 639b) are vertically aligned with one another.

As another example, FIG. 7 is a partially schematic diagram of a pixel arrangement 770 configured in accordance with various embodiments of the present technology. As shown, the pixel arrangement 770 includes four pixels: a first pixel 729a, a second pixel 739a, a third pixel 729b, and a fourth pixel 739b. In the pixel arrangement 770, similar pixels (e.g., first pixel 729a and third pixel 729b, and second pixel 739a and fourth pixel 739b) are horizontally aligned with one another.

As still another example, FIG. 8 is a partially schematic diagram of a pixel arrangement 870 configured in accordance with various embodiments of the present technology. As shown, the pixel arrangement 870 includes four pixels: a first pixel 829a, a second pixel 839a, a third pixel 829b, and a fourth pixel 839b. In the pixel arrangement 870, similar pixels (e.g., first pixel 829a and third pixel 829b, and second pixel 839a and fourth pixel 839b) are arranged diagonally from one another in an opposite direction from the pixel arrangement 420 of FIG. 4A.

As yet another example, FIG. 9 is a partially schematic diagram of a pixel arrangement 970 configured in accordance with various embodiments of the present technology. As shown, the pixel arrangement 970 includes two pixels: a first pixel 929 and a second pixel 939. In the pixel arrangement 970, the first pixel 929 and the second pixel 939 are vertically aligned with one another with the second pixel 939 positioned over the first pixel 929. In other embodiments, the first pixel 929 and the second pixel 939 can be vertically aligned with one another with the first pixel 929 positioned over the second pixel 939.

Figure 10:
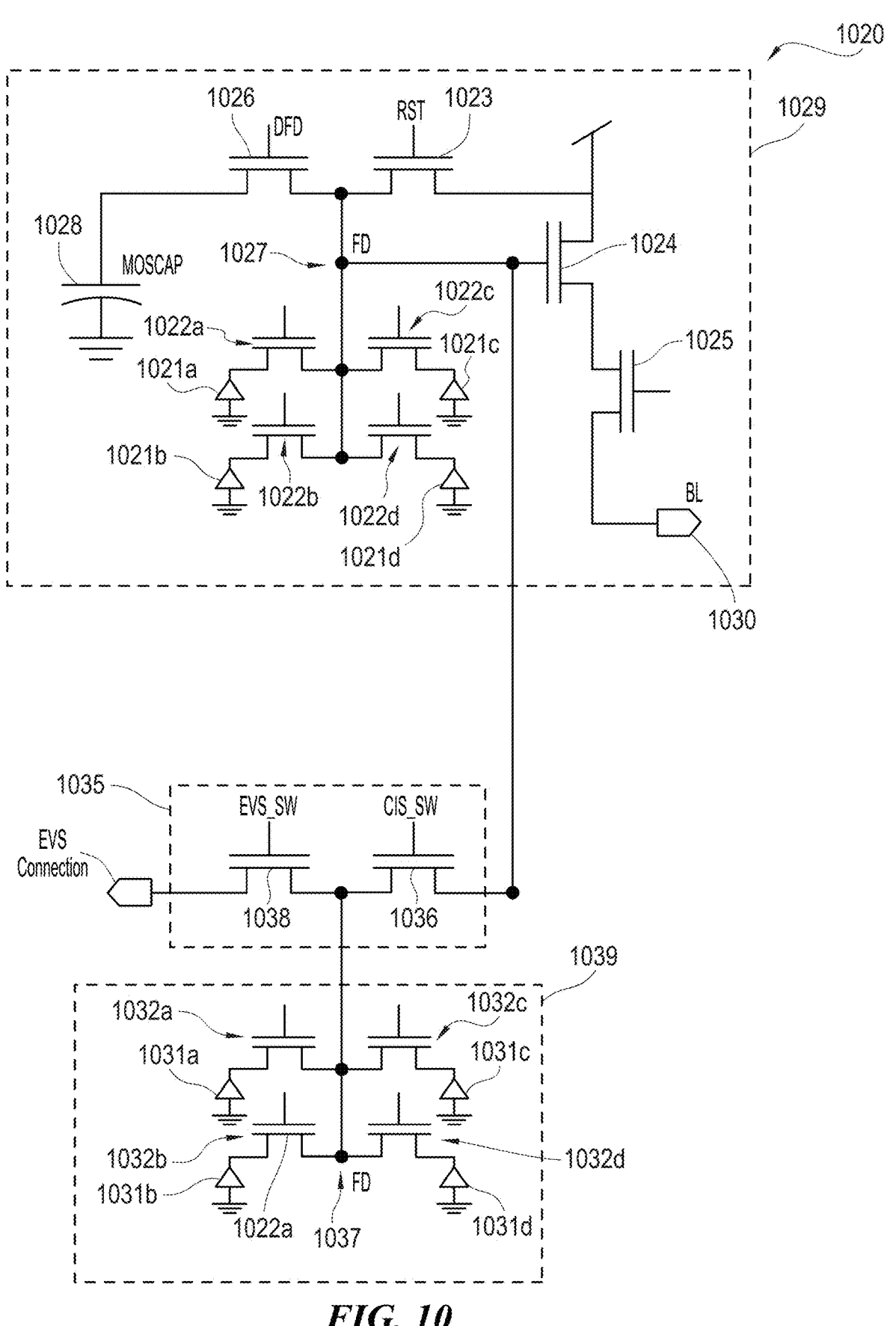
FIG. 10 is a partially schematic circuit diagram of another pixel arrangement of two pixels, the pixel arrangement configured in accordance with various embodiments of the present technology.

FIG. 10 is a partially schematic circuit diagram of another pixel arrangement 1020 configured in accordance with various embodiments of the present technology. As shown, the pixel arrangement 1020 includes a first pixel 1029 and a second pixel 1039. The first pixel 1029 and/or the second pixel 1039 may be examples of one of the pixels of the pixel array 108 of FIG. 1; the first pixel 229 of FIG. 2; the second pixel 239 of FIG. 2; one or more of the pixels 429a, 429b, 439a, and/or 439b of FIG. 4A, or another pixel configured in accordance with various embodiments of the present technology. As shown, the architecture/arrangement of the first pixel 1029 and the second pixel 1039 are each generally similar to the architecture/arrangement of the first pixel 429a and the second pixel 439*a*, respectively, of the pixel arrangement 420 of FIG. 4A except that the first pixel 1029 also includes a dual floating diffusion (DFD) switch 1026 (e.g., a transistor, a standard switch, etc.) that can selectively couple the floating diffusion 1027 of the first pixel 1029 to a MOS capacitor 1028 coupled to ground (e.g., for dual conversion gain (DCG) operation and/or other high dynamic range (HDR) imaging applications). Therefore, like references numbers have been used across FIGS. 4A and 10 to denote identical or at least generally similar components, and a detailed discussion of the pixel arrangement 1020 is largely omitted here for the sake of brevity in light of the detailed discussion of the pixel arrangement 420 provided above.

Similar to the pixel arrangement 420 of FIG. 4A, the pixel arrangement 1020 of FIG. 10 can include a mode switch 1035 that facilitates operating the pixel arrangement 1020 in any one of the three different modes: a CIS only mode, a hybrid CIS and EVS mode, and an EVS only mode. For example, in the illustrated embodiment, the mode switch 1035 includes a first switch 1036 and a second switch 1038. The first switch 1036 and the second switch 1038 are arranged with respect to the first pixel 1029 and the second pixel 1039 in a manner generally similar to how the first switch 436*a* and the second switch 438*a* of the mode switch circuit of the pixel arrangement 420 of FIG. 4A are arranged with respect to the first pixel 429*a* and the second pixel 439*a* of FIG. 4A. Therefore, a detailed discussion of the first switch 1036 and the second switch 1038 is largely omitted here for the sake of brevity in light of the detailed discussion of the first switch 436*a* and the second switch 438*a* of the mode switch circuit of the pixel arrangement 420 provided above.

Figure 11:
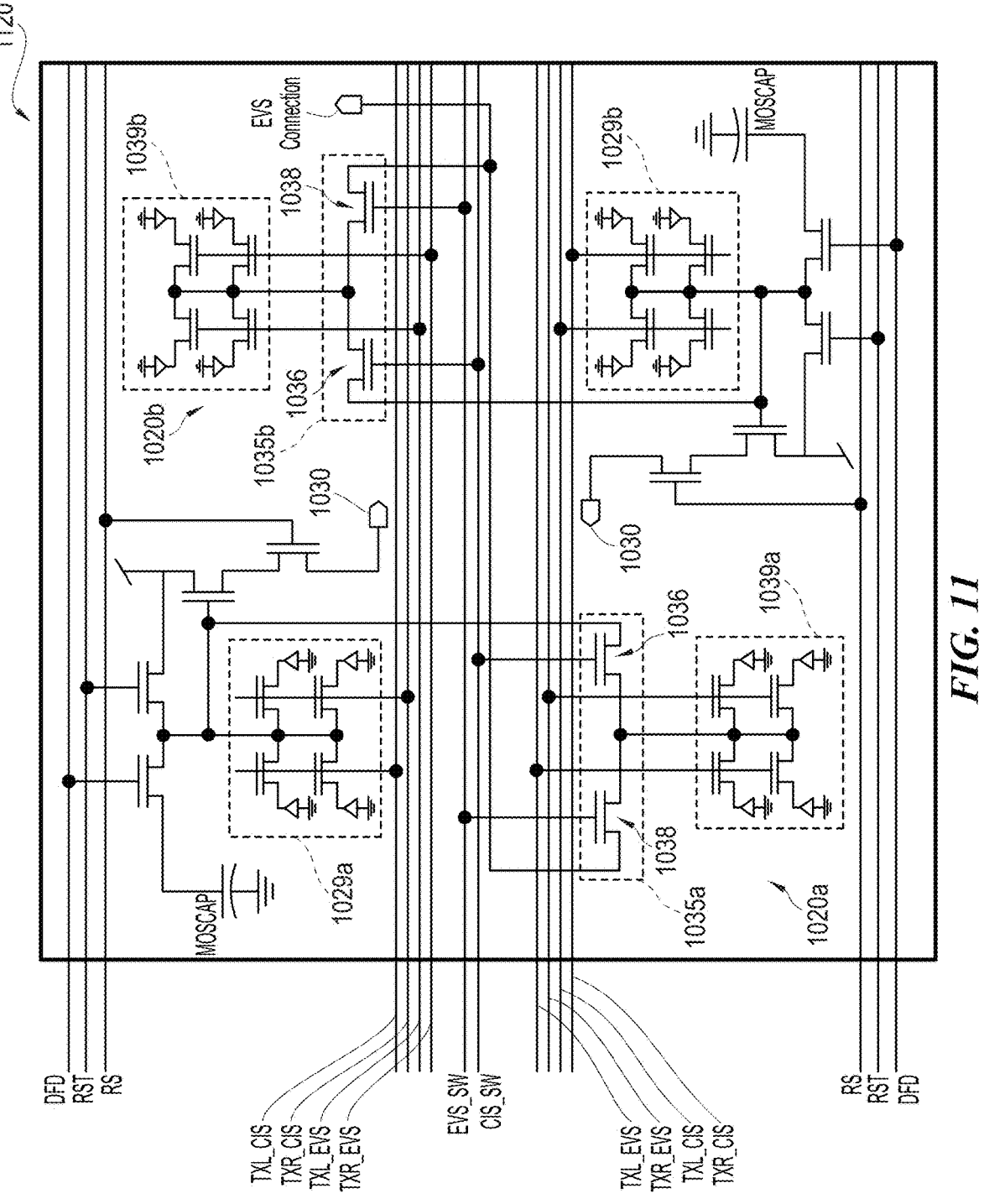
FIG. 11 is a partially schematic circuit diagram of a pixel arrangement incorporating multiple instances of the pixel arrangement of FIG. 10 and configured in accordance with various embodiments of the present technology.

FIG. 11 is a partially schematic circuit diagram of a pixel arrangement 1120 incorporating multiple instances of the pixel arrangement 1020 of FIG. 10. In particular, the pixel arrangement 1120 is a 2×2 pixel array that includes a first instance of the pixel arrangement 1020 (referred to herein as a first pixel arrangement 1020*a*) and a second instance of the pixel arrangement 1020 (referred to herein as a second pixel arrangement 1020*b*). The first pixel arrangement 1020*a* and the second pixel arrangement 1020*b* are positioned in the pixel arrangement 1120 such that similar pixels (e.g., a first pixel 1029*a* of the first pixel arrangement 1020*a* and a first pixel 1029*b* of the second pixel arrangement 1020*b*, and a second pixel 1039*a* of the first pixel arrangement 1020*a* and a second pixel 1039*b* of the second pixel arrangement 1020*b*) are positioned diagonally in the 2×2 pixel array of the pixel arrangement 1120. The first pixel 1029*a*, the first pixel 1029*b*, the second pixel 1039*a*, and the second pixel 1039*b* may be examples of one of the pixels of the pixel array 108 of FIG. 1; the first pixel 229 of FIG. 2; the second pixel 239 of FIG. 2; one or more of the pixels 429*a*, 429*b*, 439*a*, and/or 439*b* of FIG. 4A, or another pixel configured in accordance with various embodiments of the present technology. As shown, the architecture/arrangement of the pixel arrangement 1120 is generally similar to the architecture/arrangement of the pixel arrangement 420 of FIG. 4A. Therefore, a detailed discussion of the pixel arrangement 1120 is largely omitted here for the sake of brevity in light of the detailed discussion of the pixel arrangement 420 provided above.

The first pixel arrangement 1020*a* and/or the second pixel arrangement 1020*b* can include a mode switch. In the illustrated embodiment, the first pixel arrangement 1020*a* includes a mode switch 1035*a*, and the second pixel arrangement 1020*b* includes a mode switch 1035*b*. Each of the mode switches 1035*a* and 1035*b* include a first switch 1036 and a second switch 1038 that facilitate operating the pixel arrangement 1120 in any one of three modes: a CIS only mode, a hybrid CIS and EVS mode, and an EVS only mode. As shown, the first switch 1036 of the mode switch 1035*a* and the first switch 1036 of the mode switch 1035*b* are each configured to receive a first switch control signal CIS_SW, and the second switch 1038 of the mode switch 1035*a* and the second switch 1038 of the mode switch 1035*b* are each configured to receive a second switch control signal EVS_SW. As discussed above with reference to FIG. 4A, the first switch 1036 of the mode switch 1035*a* can be configured to receive a different switch control signal from the first switch 1036 of the mode switch 1035*b* in other embodiments of the present technology, and/or the second switch 1038 of the mode switch 1035*a* can be configured to receive a different switch control signal from the second switch 1038 of the mode switch 1035*b*. Separate control signals can facilitate greater control over which pixels of the pixel arrangement 1120 are operated to capture CIS information and which pixels of the pixel arrangement 1120 are operated to capture non-CIS information while the pixel arrangement 1120 is operated in the hybrid CIS and EVS mode.

As also illustrated in FIG. 11, the transfer transistors of the first pixel 1029*a* and the transfer transistors of the first pixel 1029*b* are controlled using the same signals TXL_CIS and TXR_CIS; the transfer transistors of the second pixel 1039*a* and the transfer transistors of the second pixel 1039*b* are controlled using the same signals TXL_EVS and TXR_EVS; and the row select transistor of the first pixel 1029*a* and the row select transistor of the first pixel 1029*b* are controlled using the same signal RS. Furthermore, the row select transistor of the first pixel 1029*a* and the row select transistor of the first pixel 1029*b* are coupled to a same bitline 1030 or group of bitlines. Thus, when the pixel arrangement 1120 is operated in the CIS only mode or in the hybrid CIS and EVS mode, CIS information is read out from the first pixel arrangement 1020*a* at the same time and onto the same bitline 1030 (or group of bitlines) as CIS information read out from the second pixel arrangement 1020*b*. Moreover, both the second switch 1038 of the mode switch 1035*a* of the first pixel arrangement 1020*a* and the second switch 1038 of the mode switch 1035*b* of the second pixel arrangement 1020*b* are coupled to EVS readout circuitry (e.g., one or more of the event driven circuits included in the event driven sensing array 112 shown in FIG. 1) via a same hybrid bond or group of hybrid bonds. Thus, when the pixel arrangement 1120 is operated in the EVS only mode or in the hybrid CIS and EVS mode, non-CIS information is read out from the first pixel arrangement 1020*a* at the same time and via the same hybrid bond or group of hybrid bonds as non-CIS information read out from the second pixel arrangement 1020*b*. Therefore, non-CIS information from the first pixel arrangement 1020*a* can be read out onto a same event driven circuit or group of event driven circuits as non-CIS information from the second pixel arrangement 1020*b*.

In other embodiments, the transfer transistors of the first pixel 1029*a* and the transfer transistors of the first pixel 1029*b* can be controlled using different control signals; the transfer transistors of the second pixel 1039*a* and the transfer transistors of the second pixel 1039*b* can be controlled using difference control signals; the row select transistor of the first pixel 1029*a* and the row select transistor of the first pixel 1029*b* can be controlled using different control signals; the reset transistor of the first pixel 1029*a* and the reset transistor of the first pixel 1029*b* can be controlled using different control signals; and/or the DFD switch of the first pixel 1029*a* and the DFD switch of the first pixel 1029*b* can be controlled using different control signals. Using different control signals can facilitate independent control over various components of the first pixel arrangement 1020*a* and/or the second pixel arrangement 1020*b*. In these and other embodiments, the row select transistor of the first pixel 1029*a* can be coupled to a different bitline and/or a different group of bitlines from the row select transistor of the first pixel 1029*b*, and/or the second switch 1038 of the mode switch 1035*a* of the first pixel arrangement 1020*a* and the second switch 1038 of the mode switch 1035*b* of the second pixel arrangement 1020*b* can be coupled to different hybrid bonds, different groups of hybrid bonds, and/or different EVS readout circuitry (e.g., different event driven circuits or different groups of event driven circuits).

Similar to other pixel arrangements discussed herein, the first pixel 1029*a*, the first pixel 1029*b*, the second pixel 1039*a*, and/or the second pixel 1039*b* can be disposed underneath a color filter and/or a microlens. One or more of color filters can have one of a plurality of colors (e.g., red, green, or blue). The first pixel 1029*a*, the first pixel 1029*b*, the second pixel 1039*a*, and/or the second pixel 1039*b* can be disposed underneath color filter(s) of a same color or or different colors. Additionally, or alternatively, the first pixel 1029*a*, the first pixel 1029*b*, the second pixel 1039*a*, and/or the second pixel 1039*b* can be disposed underneath (a) a color filter having a non-RGB or clear filter, or (b) no filter.

Figures 12A, 12B, 12C, 12D:
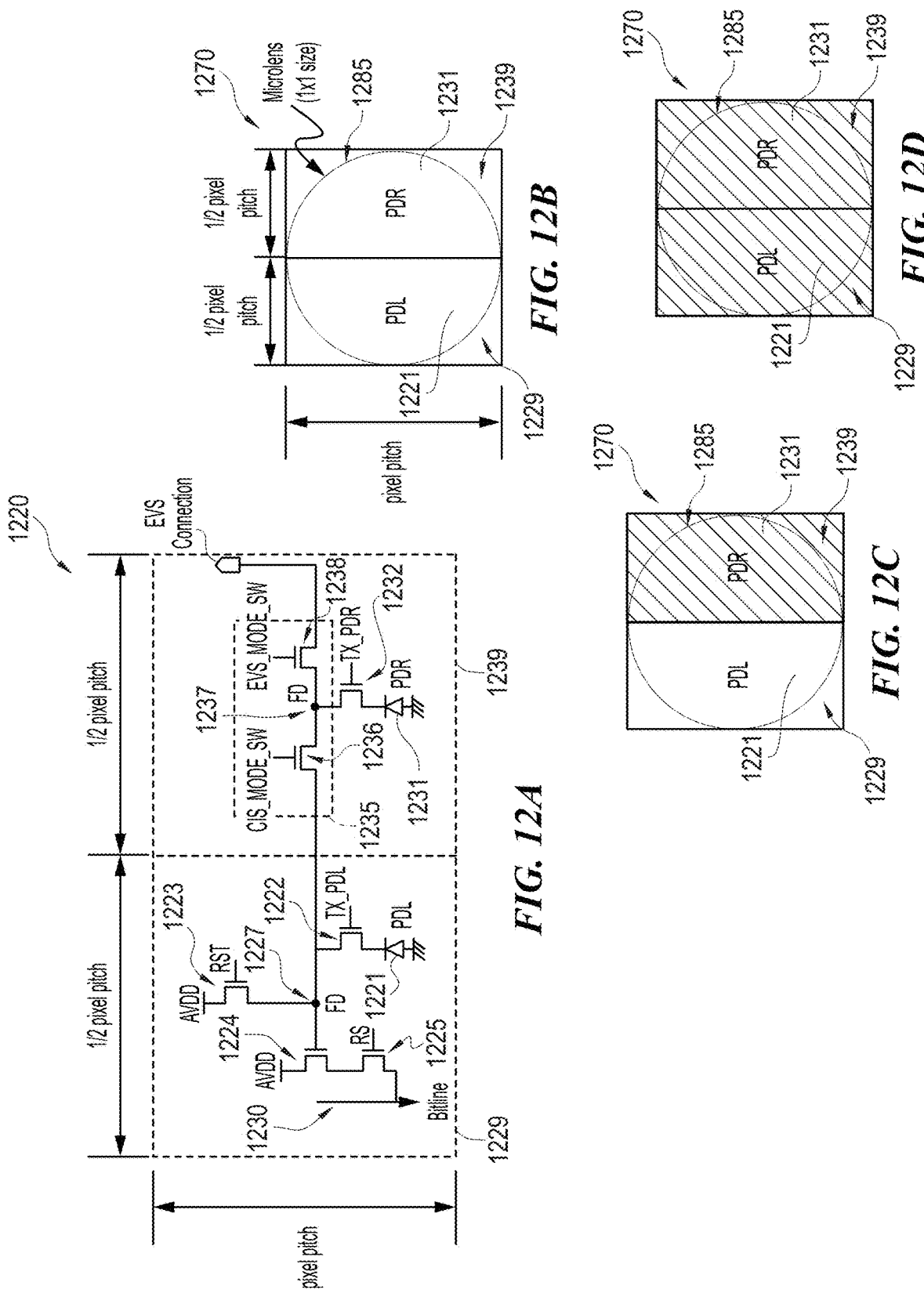
FIG. 12A is a partially schematic circuit diagram of another pixel arrangement configured in accordance with various embodiments of the present technology.
FIG. 12B-12D are partially schematic diagrams of a pixel array corresponding to the pixel arrangement of FIG. 12A and configured in accordance with various embodiments of the present technology.

The principals of the present technology may also be leveraged in phase detection autofocus (PDAF) pixel architectures. For example, FIG. 12A is a partially schematic circuit diagram of a pixel arrangement 1220 configured in accordance with various embodiments of the present technology. The pixel arrangement 1220 can be or include a dual-photosensor autofocus pixel circuit and therefore is also referred to herein as "the pixel 1220." The pixel 1220 may be an example of one of the pixels of the pixel array 108 of FIG. 1, or another pixel configured in accordance with various embodiments of the present technology. As shown, the pixel 1220 includes a left-half pixel 1229 and a right-half pixel 1239. The architecture/arrangement of the left-half pixel 1229 and the right-half pixel 1239 of the pixel 1220 are generally similar to the first pixel 229 and the second pixel 239 of the pixel arrangement 220 of FIG. 2. Therefore, like references numbers have been used across FIGS. 2 and 12A to denote identical or at least generally similar components, and a detailed discussion of the pixel 1220 is largely omitted here for the sake of brevity in light of the detailed discussion of the pixel arrangement 220 provided above.

In contrast with the first pixel 229 and the second pixel 239 of the pixel arrangement 220 of FIG. 2 that each include a pitch of one full pixel, the pitch of the left-half pixel 1229 and the pitch of the right-half pixel 1239 of the pixel 1220 of FIG. 12A are each half of a pixel. Thus, a photosensor 1221 of the left-half pixel 1229 can be considered a left photosensor of the dual-photosensor autofocus pixel circuit 1220 (e.g., a left channel of the pixel 1220), and a photosensor 1231 of the right-half pixel 1239 can be considered a right photosensor of the dual-photosensor autofocus pixel circuit 1220 (e.g., a right channel of the pixel 1220).

Similar to the pixel arrangement 220 of FIG. 2, the pixel 1220 of FIG. 12A can include a mode switch 1235 that facilitates operating the pixel 1220 in any one of the three different modes: a CIS only mode, a hybrid CIS and EVS mode, and an EVS only mode. For example, in the illustrated embodiment, the mode switch 1235 includes a first switch 1236 and a second switch 1238. The first switch 1236 and the second switch 1238 are arranged with respect to the left-half pixel 1229 and the right-half pixel 1239 in a manner generally similar to how the first switch 236 and the second switch 238 of the mode switch circuit 235 of the pixel arrangement 220 of FIG. 2 are arranged with respect to the first pixel 229 and the second pixel 239 of FIG. 2. Therefore, a detailed discussion of the first switch 1236 and the second switch 1238 is largely omitted here for the sake of brevity in light of the detailed discussion of the first switch 236 and the second switch 238 of the mode switch circuit 235 provided above with reference to FIG. 2.

As shown in FIG. 12A, the first switch 1236 is configured to receive a first switch control signal CIS_MODE_SW. As such, the first switch 1236 is configured to be selectively activated based at least in part on the first switch control signal CIS_MODE_SW. Additionally, or alternatively, the second switch 1238 is configured to receive a second switch control signal EVS_MODE_SW. Thus, the second switch 1238 is configured to be selectively activated based at least in part on the second switch control signal EVS_MOD-E_SW.

FIGS. 12B-12D are partially schematic diagrams of a pixel array 1270 that corresponds to the pixel arrangement 1220 of FIG. 12A. The pixel array 1270 is also referred to herein as "the photosensor array 1270." Each of FIGS. 12B-12D illustrates one of the operating modes of the pixel 1220. For example, the photosensor array 1270 shown in FIG. 12B illustrates the CIS only mode of the pixel 1220 in which the left-half pixel 1229 and the right-half pixel 1239 can each be used to capture a CIS image signal (e.g., to form phase information). In some embodiments, to place the pixel 1220 of FIG. 12A in the CIS only mode illustrated by the photosensor array 1270 shown in FIG. 12B, the first switch control signal CIS_MODE_SW can be asserted (thereby activating the first switch 1236 of the mode switch 1235 of the pixel 1220) while the second switch control signal EVS_MODE_SW is not asserted (thereby deactivating the second switch 1238 of the mode switch 1235). Operation of the pixel 1220 in the CIS only mode can be generally similar to operation of the pixel arrangement 220 of FIG. 2 in the CIS only mode described in detail above with reference to FIGS. 2 and 3A. Therefore, a detail discussion of the CIS only mode of the pixel 1220 is omitted here for the sake of brevity.

The photosensor array 1270 shown in FIG. 12C illustrates the hybrid CIS and EVS mode of the pixel 1220 of FIG. 12A in which the left-half pixel 1229 is used to capture CIS image signals, and the right-half pixel 1239 is used to capture event signals. In some embodiments, to place the pixel 1220 of FIG. 12A in the hybrid CIS and EVS mode illustrated by the photosensor array 1270 shown in FIG. 12C, the second switch control signal EVS_MODE_SW can be asserted (thereby activating the second switch 1238 of the mode switch 1235 of the pixel 1220) while the first switch control signal CIS_MODE_SW is not asserted (thereby deactivating the first switch 1236 of the mode switch 1235). Operation of the pixel 1220 in the hybrid CIS and EVS mode can be generally similar to operation of the pixel arrangement 220 of FIG. 2 in the hybrid CIS and EVS mode described in detail above with reference to FIGS. 2 and 3B. Therefore, a detail discussion of the hybrid CIS and EVS mode of the pixel 1220 is omitted here for the sake of brevity.

The photosensor array 1270 shown in FIG. 12D illustrates the EVS only mode of the pixel 1220 of FIG. 12A in which the left-half pixel 1229 and the right-half pixel 1239 are each used to capture event signals. In some embodiments, to place the pixel 1220 of FIG. 12A in the EVS only mode illustrated by the photosensor array 1270 shown in FIG. 12D, both the first switch control signal CIS_MODE_SW and the second switch control signal EVS_MODE_SW can be asserted, thereby activating the first switch 1236 and the second switch 1238, respectively, of the mode switch 1235 of the pixel 1220. Operation of the pixel 1220 in the EVS only mode can be generally similar to operation of the pixel arrangement 220 of FIG. 2 in the EVS only mode described in detail above with reference to FIGS. 2 and 3C. Therefore, a detail discussion of the EVS only mode of the pixel 1220 is omitted here for the sake of brevity.

Referring again to FIG. 12B, a microlens 1285 can be positioned over the photosensor 1221 and the photosensor 1231 of the pixel 1220. In these and other embodiments, the microlens 1285 can be configured to direct first light and second light to the photosensor 1221 and the photosensor 1231, respectively, of the pixel 1220. In other embodiments, different microlenses can be positioned over the photosensor 1221 and the photosensor 1231. In some embodiments, different color filters can be positioned over the photosensor 1221 and the photosensor 1231. In other embodiments, a color filter can be shared between the photosensor 1221 and the photosensor 1231. One or more of the color filters can be configured to pass light corresponding to a specific color (e.g., red, green, or blue, or a non-RGB color) through to the photosensor 1221 and/or the photosensor 1231 positioned beneath the color filter(s). Additionally, or alternatively, one or more of the color filters can be clear such that all light incident on the color filter(s) can pass through the color filter(s) and strike the photosensors 1221 and/or 1231 positioned beneath the color filter.

The left-half pixel 1229 and the right-half pixel 1239 of the pixel 1220 of FIG. 12A are illustrated as being aligned horizontally with respect to one another. Thus, the photosensor 1221 can correspond to a left channel of the pixel 1220, and the photosensor 1231 can correspond to a right channel of the pixel 1220. In other embodiments, the position of the left-half pixel 1229 and the right-half pixel 1239 can be swapped such that the photosensor 1221 can correspond to a right channel of the pixel 1220 and the photosensor 1231 can correspond to a left channel of the pixel 1220. In still other embodiments, the left-half pixel 1229 and the right-half pixel 1239 can be vertically aligned with one another such that (a) the left-half pixel 1229 is positioned over the right-half pixel 1239 or (b) the left-half pixel 1229 is positioned under the right-half pixel 1239. In these embodiments, the photosensor 1221 can correspond to an upper channel or a lower channel of the pixel 1220, respectively, and the photosensor 1231 can correspond to a lower channel or an upper channel of the pixel 1220, respectively.

Figure 13:
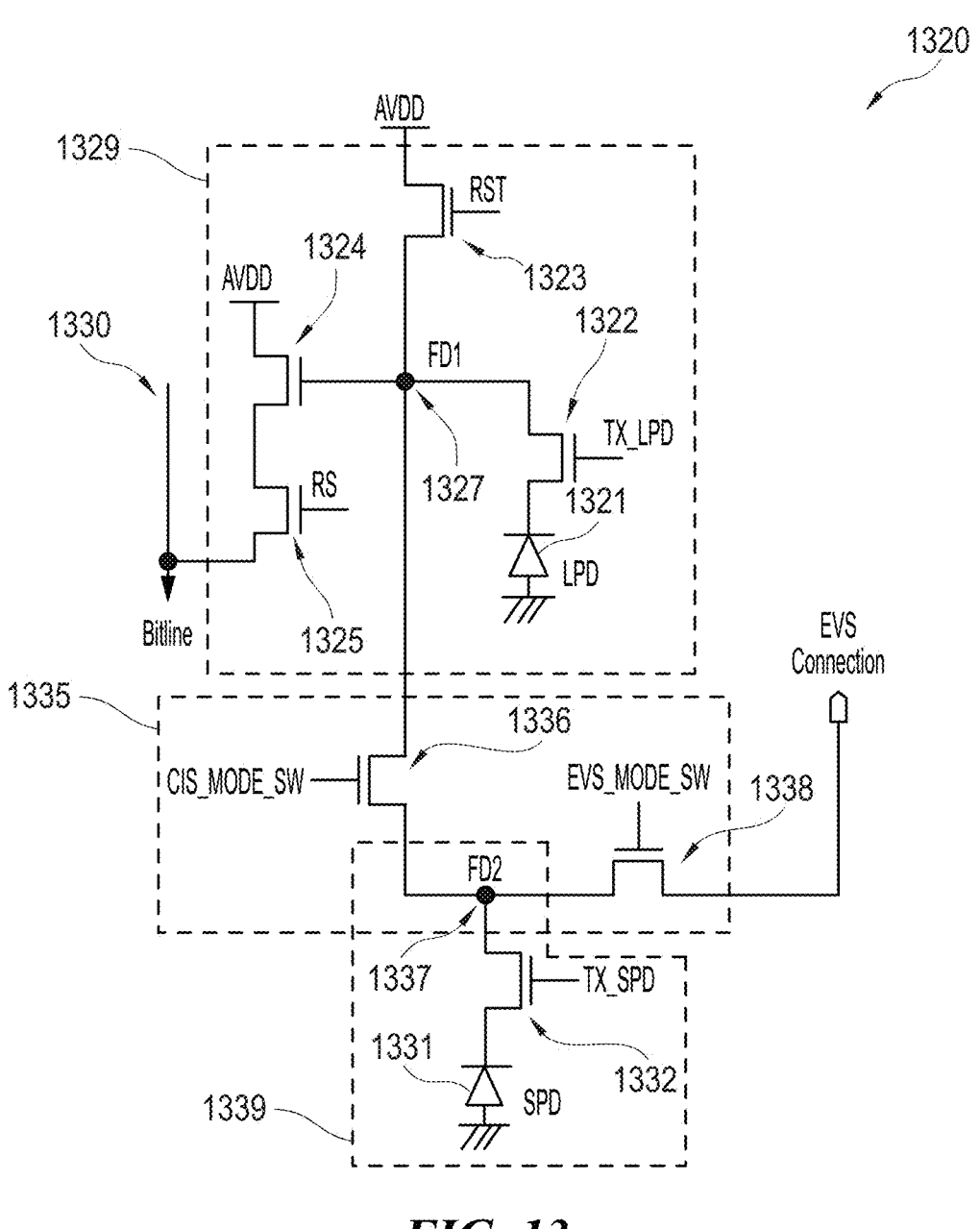
FIG. 13 is a partially schematic circuit diagram of another pixel arrangement configured in accordance with various embodiments of the present technology.

The principals of the present technology may also be leveraged in split photosensor pixel architectures. For example, FIG. 13 is a partially schematic circuit diagram of a pixel arrangement 1320 configured in accordance with various embodiments of the present technology. The pixel arrangement 1320 can be or include a split photosensor (e.g., a split photodiode, multi-photodiode) pixel circuit and therefore is also referred to herein as "the pixel 1320." The pixel 1320 may be an example of one of the pixels of the pixel array 108 of FIG. 1, or another pixel configured in accordance with various embodiments of the present technology. As shown, the pixel 1320 includes a first portion 1329 and a second portion 1339. The architecture/arrangement of the first portion 1329 and the second portion 1339 of the pixel 1320 are generally similar to the first pixel 229 and the second pixel 239 of the pixel arrangement 220 of FIG. 2. Therefore, like references numbers have been used across FIGS. 2 and 13 to denote identical or at least generally similar components, and a detailed discussion of the pixel 1320 is largely omitted here for the sake of brevity in light of the detailed discussion of the pixel arrangement 220 provided above. The first portion 1329 of the pixel 1320 includes a photosensor 1321, and the second portion 1339 of the pixel 1320 includes a photosensor 1331. The photosensor 1321 can be configured to have a different sensitivity and/or full well capacity from the photosensor 1331. For example, the photosensor 1321 can be a large photosensor (e.g., a large photodiode), and the photosensor 1331 can be a small photosensor (e.g., a small photodiode).

Similar to the pixel arrangement 220 of FIG. 2, the pixel 1320 of FIG. 13 can include a mode switch 1335 that facilitates operating the pixel 1320 in any one of the three different modes: a CIS only mode, a hybrid CIS and EVS mode, and an EVS only mode. For example, in the illustrated embodiment, the mode switch 1335 includes a first switch 1336 and a second switch 1338. The first switch 1336 and the second switch 1338 are arranged with respect to the first portion 1329 and the second portion 1339 in a manner generally similar to how the first switch 236 and the second switch 238 of the mode switch circuit 235 of the pixel arrangement 220 of FIG. 2 are arranged with respect to the first pixel 229 and the second pixel 239 of FIG. 2. Therefore, a detailed discussion of the first switch 1336 and the second switch 1338 is largely omitted here for the sake of brevity in light of the detailed discussion of the first switch 236 and the second switch 238 of the mode switch circuit 235 provided above with reference to FIG. 2.

As shown in FIG. 13, the first switch 1336 is configured to receive a first switch control signal CIS_MODE_SW. As such, the first switch 1336 is configured to be selectively activated based at least in part on the first switch control signal CIS_MODE_SW. Additionally, or alternatively, the second switch 1338 is configured to receive a second switch control signal EVS_MODE_SW. Thus, the second switch 1338 is configured to be selectively activated based at least in part on the second switch control signal EVS_MOD-E_SW.

When the pixel 1320 is operated in the CIS only mode, the first portion 1329 and the second portion 1339 can each be used to capture a CIS image signal. In some embodiments, to place the pixel 1320 in the CIS only mode, the first switch control signal CIS_MODE_SW can be asserted (thereby activating the first switch 1336 of the mode switch 1335) while the second switch control signal EVS_MODE_SW is not asserted (thereby deactivating the second switch 1338 of the mode switch 1335). Operation of the pixel 1320 in the CIS only mode can be generally similar to operation of the pixel arrangement 220 of FIG. 2 in the CIS only mode described in detail above with reference to FIGS. 2 and 3A. Therefore, a detail discussion of the CIS only mode of the pixel 1320 is omitted here for the sake of brevity.

When the pixel 1320 is operated in the hybrid CIS and EVS mode, the first portion 1329 can be used to capture CIS image signals, and the second portion 1339 can be used to capture event signals. In some embodiments, to place the pixel 1320 in the hybrid CIS and EVS mode, the second switch control signal EVS_MODE_SW can be asserted (thereby activating the second switch 1338 of the mode switch 1335) while the first switch control signal CIS-_MODE_SW is not asserted (thereby deactivating the first switch 1336 of the mode switch 1335). Operation of the pixel 1320 in the hybrid CIS and EVS mode can be generally similar to operation of the pixel arrangement 220 of FIG. 2 in the hybrid CIS and EVS mode described in detail above with reference to FIGS. 2 and 3B. Therefore, a detail discussion of the hybrid CIS and EVS mode of the pixel 1320 is omitted here for the sake of brevity.

When the pixel 1320 is operated in the EVS only mode, the first portion 1329 and the second portion 1339 can each be used to capture event signals. In some embodiments, to place the pixel 1320 in the EVS only mode, both the first switch control signal CIS_MODE_SW and the second switch control signal EVS_MODE_SW can be asserted, thereby activating the first switch 1336 and the second switch 1338, respectively, of the mode switch 1335. Operation of the pixel 1320 in the EVS only mode can be generally similar to operation of the pixel arrangement 220 of FIG. 2 in the EVS only mode described in detail above with reference to FIGS. 2 and 3C. Therefore, a detail discussion of the EVS only mode of the pixel 1320 is omitted here for the sake of brevity.

C. Conclusion

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those skilled in the relevant art will recognize. For example, although steps are presented in a given order above, alternative embodiments may perform steps in a different order. Furthermore, the various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where context permits, singular or plural terms may also include the plural or singular term, respectively. In addition, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded. Moreover, as used herein, the phrases "based on," "depends on," "as a result of," and "in response to" shall not be construed as a reference to a closed set of conditions. For example, an exemplary step that is described as "based on condition A" may be based on both condition A and condition B without departing from the scope of the present disclosure. In other words, as used herein, the phrase "based on" shall be construed in the same manner as the phrase "based at least in part on" or the phrase "based at least partially on." Also, the terms "connect" and "couple" are used interchangeably herein and refer to both direct and indirect connections or couplings. For example, where the context permits, element A "connected" or "coupled" to element B can refer (i) to A directly "connected" or directly "coupled" to B and/or (ii) to A indirectly "connected" or indirectly "coupled" to B.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A pixel arrangement, comprising:
   a first photosensor configured to photogenerate first charge based at least in part on first light incident on the first photosensor;
   a first floating diffusion configured to receive the first charge from the first photosensor;
   a second photosensor different from the first photosensor and configured to photogenerate second charge based at least in part on second light incident on the second photosensor;
   a second floating diffusion configured to receive the second charge from the second photosensor; and
   a mode switch including—
      a first switch selectively coupling the second floating diffusion to the first floating diffusion, and
      a second switch different from the first switch and configured to selectively couple the second floating diffusion to event vision sensor (EVS) readout circuitry,
   wherein the mode switch is usable to transition the pixel arrangement between (i) a first mode in which the pixel arrangement is controllable to generate first output corresponding to intensity information of the first light, the second light, or both the first light and the second light; and (ii) a second mode in which the pixel arrangement is controllable to generate second output corresponding to contrast information of the first light, the second light, or both the first light and the second light.

2. The pixel arrangement of claim 1, wherein the second switch is coupled to the first switch via the second floating diffusion.

3. The pixel arrangement of claim 1, further comprising:
   a first transfer transistor configured to selectively couple the first photosensor to the first floating diffusion, wherein the first transfer transistor is different from the first switch; and
   a second transfer transistor different from the first transfer transistor and configured to selectively couple the second photosensor to the second floating diffusion.

4. The pixel arrangement of claim 1, wherein:
   the first output corresponds to intensity information of both the first light and the second light; and
   to generate the first output corresponding to intensity information of the second light, the pixel arrangement is controllable to activate the first switch of the mode switch such that (a) the first switch and the second switch are in an activated and a deactivated state, respectively, (b) the second floating diffusion is coupled to the first floating diffusion and (c) the second charge is transferred to readout circuitry.

5. The pixel arrangement of claim 1, wherein:
the second output corresponds to contrast information of the second light; and
to generate the second output corresponding to the contrast information of the second light, the pixel arrangement is controllable to activate the second switch of the mode switch such that the second floating diffusion is coupled to the EVS readout circuitry.

6. The pixel arrangement of claim 5, wherein, to generate the second output corresponding to the contrast information of the second light, the pixel arrangement is controllable to deactivate the first switch of the mode switch such that (a) the first switch and the second switch are simultaneously in a deactivated state and an activated state, respectively, (b) the first floating diffusion is uncoupled from the second floating diffusion, and (c) the second output corresponds to contrast information of only the second light.

7. The pixel arrangement of claim 5, wherein:
when in the second mode, the pixel arrangement is further controllable to generate third output corresponding to intensity information of the first light; and
to generate the third output corresponding to the intensity information of the first light, the pixel arrangement is controllable to deactivate the first switch such that (a) the first switch and the second switch are simultaneously in a deactivated state and an activated state, respectively, (b) the first floating diffusion is uncoupled from the second floating diffusion, and (c) the third output corresponds to intensity information of only the first light.

8. The pixel arrangement of claim 7, wherein:
the second output corresponds to contrast information of only the second light; and
when in the second mode, the pixel arrangement is controllable to simultaneously generate the second output and the third output.

9. The pixel arrangement of claim 5, wherein:
the second output further corresponds to contrast information of the first light; and
to generate the second output corresponding to the contrast information of the first light, the pixel arrangement is controllable to activate the first switch of the mode switch such that (a) the first switch and the second switch of the mode switch are simultaneously in an activated state and (b) the first floating diffusion is coupled to the EVS readout circuitry.

10. The pixel arrangement of claim 1, wherein:
the first output corresponds to intensity information of both the first light and the second light;
the second output corresponds to contrast information of both the first light and the second light; and
the mode switch is usable to transition the pixel arrangement between (i) the first mode, (ii) the second mode, and (iii) a third mode in which the pixel arrangement is controllable to generate third output corresponding to (a) intensity information of the first light and (b) contrast information of the second light.

11. The pixel arrangement of claim 1, wherein the first switch and the second switch are positioned on a same die as the first photosensor and the second photosensor.

12. The pixel arrangement of claim 1, wherein:
the pixel arrangement includes a pixel;

the pixel includes the first photosensor, the second photosensor, the first floating diffusion, and the second floating diffusion;
the first photosensor has a first sensitivity; and
the second photosensor has a second sensitivity different from the first photosensor.

13. The pixel arrangement of claim 1, further comprising a split photosensor pixel, wherein—
the first photosensor is a first photosensor of the split photosensor pixel; and
the second photosensor is a second photosensor of the split photosensor pixel.

14. The pixel arrangement of claim 13, wherein the first photosensor and the second photosensor are positioned beneath a same microlens.

15. The pixel arrangement of claim 1, further comprising a first pixel and a second pixel different from the first pixel, wherein—
the first pixel includes the first photosensor and the first floating diffusion; and
the second pixel include the second photosensor and the second floating diffusion.

16. The pixel arrangement of claim 15, wherein:
the first pixel further includes a third photosensor configured to photogenerate third charge based at least in part on third light incident on the third photosensor;
the first floating diffusion is configured to receive the third charge from the third photosensor;
when in the first mode, the pixel arrangement is controllable to generate the first output such that the first output corresponds to the intensity information of the first light, the intensity information of the second light, intensity information of the third light, or any first combination thereof; and
when in the second mode, the pixel arrangement is controllable to generate the second output such that the second output corresponds to the contrast information of the first light, the contrast information of the second light, contrast information of the third light, or any second combination thereof.

17. The pixel arrangement of claim 16, wherein:
the second pixel further includes a fourth photosensor configured to photogenerate fourth charge based at least in part on fourth light incident on the fourth photosensor;
the second floating diffusion is configured to receive the fourth charge from the fourth photosensor;
when in the first mode, the pixel arrangement is controllable to generate the first output such that the first output corresponds to the intensity information of the first light, the intensity information of the second light, the intensity information of the third light, intensity information of the fourth light, or any third combination thereof; and
when in the second mode, the pixel arrangement is controllable to generate the second output such that the second output corresponds to the contrast information of the first light, the contrast information of the second light, the contrast information of the third light, contrast information of the fourth light, or any fifth combination thereof.

18. The pixel arrangement of claim 15, wherein the first pixel and the second pixel are vertically aligned with one another.

19. The pixel arrangement of claim 15, wherein the first pixel and the second pixel are horizontally aligned with one another.

20. The pixel arrangement of claim 15, further comprising:

a third pixel different from the first and second pixels and including— a third photosensor configured to photogenerate third charge based at least in part on third light incident on the third photosensor, and a third floating diffusion configured to receive the third charge from the third photosensor;

a fourth pixel different first, second, and third pixels and including— a fourth photosensor configured to photogenerate fourth charge based at least in part on fourth light incident on the fourth photosensor, and a fourth floating diffusion configured to receive the fourth charge from the fourth photosensor; and a second mode switch including— a third switch selectively coupling the third floating diffusion to the fourth floating diffusion, and a fourth switch different from the third switch and configured to selectively couple the fourth floating diffusion to second EVS readout circuitry, wherein the second mode switch is usable to transition the pixel arrangement between (i) a third mode in which the pixel arrangement is controllable to generate third output corresponding to intensity information of the third light, the fourth light, or both the third light and the fourth light; and (ii) a fourth mode in which the pixel arrangement is controllable to generate fourth output corresponding to contrast information of the third light, the fourth light, or both the third light and the fourth light.

21. The pixel arrangement of claim 20, wherein:

the first, second, third, and fourth pixels are arranged in a 2×2 pixel array;

the first pixel and the third pixel are diagonally offset from one another within the 2×2 pixel array; and the second pixel and the fourth pixel are diagonally offset from one another within the 2×2 pixel array.

22. The pixel arrangement of claim 20, wherein the first, second, third, and fourth pixels are coupled to a same bitline.

23. A system, comprising:

a first die including— at least one pixel having:

a first photosensor;

a first floating diffusion configured to receive first charge photogenerated by the first photosensor;

a first transfer transistor configured to selectively couple the first photosensor to the first floating diffusion;

a second photosensor different from the first photosensor;

a second floating diffusion configured to receive second charge photogenerated by the second photosensor; and a second transfer transistor configured to selectively couple the second photosensor to the second floating diffusion, and a mode switch including:

a first switch selectively coupling the second floating diffusion to the first floating diffusion, and a second switch coupled to the first switch via the second floating diffusion; and a second die different from the first die and including event vision sensor (EVS) readout circuitry, wherein the second switch is configured to selectively couple the second floating diffusion to the EVS readout circuitry.

24. The system of claim 23, wherein the mode switch is usable to transition the at least one pixel between (i) a first mode in which the at least one pixel is controllable to output complementary metal oxide semiconductor (CMOS) image sensor (CIS) information corresponding to the first charge, the second charge, or both the first charge and the second charge; and (ii) a second mode in which the at least one pixel is controllable to output non-CIS information corresponding to the first charge, the second charge, or both the first charge and the second charge.

25. The system of claim 24, wherein:

in the first mode, the CIS information includes intensity and/or color information corresponding to first light incident on the first and second photosensors; and in the second mode— the non-CIS information includes events signals corresponding to change in luminance, event detection, and/or phase detection auto-focus information corresponding to second light incident on the second photosensor, and the CIS information includes intensity and/or color information corresponding to third light incident on the first photosensor.

26. The system of claim 24, wherein:

the at least one pixel further includes— a third photosensor different from the first and second photosensors and configured to photogenerate third charge based on light incident on the third photosensor, and a fourth photosensor different from the first, second, and third photosensors and configured to photogenerate fourth charge based on light incident on the fourth photosensor, and the EVS readout circuitry is configured to receive non-CIS information from the first photosensor, the second photosensor, the third photosensor, and the fourth photosensor corresponding to the first charge, the second charge, the third charge, and the fourth charge, respectively.

27. The system of claim 23, wherein:

in the first mode, the at least one pixel is controllable to output CIS information corresponding to both the first charge and the second charge; and in the second mode, the at least one pixel is controllable to simultaneously output non-CIS information corresponding to the second charge and CIS information corresponding to the first charge.

28. A pixel, comprising:

a photosensor selectively coupled to a first floating diffusion through a transfer gate; and a mode switch configured to transition the pixel between (i) a first mode in which the pixel is controllable to output complementary metal oxide semiconductor (CMOS) image sensor (CIS) information corresponding to light incident on the photosensor, and (ii) a second mode in which the pixel is controllable to output non-CIS information corresponding to light incident on the photosensor, wherein the mode switch includes:

a first switch selectively coupling (a) a second floating diffusion to the first floating diffusion and (b) the first floating diffusion and the second floating diffusion to CIS readout circuitry, and a second switch (a) coupled to the first switch via the second floating diffusion and (b) selectively coupling the second floating diffusion to event vision sensor (EVS) readout circuitry.

* * * * *